United States Patent
Ohnishi

(10) Patent No.: US 7,416,836 B2
(45) Date of Patent: Aug. 26, 2008

(54) DEVELOPING SOLUTION FOR LITHOGRAPHIC PRINTING PLATE PRECURSOR AND METHOD FOR MAKING LITHOGRAPHIC PRINTING PLATE

(75) Inventor: Hironori Ohnishi, Haibara-gun (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 11/643,828

(22) Filed: Dec. 22, 2006

(65) Prior Publication Data

US 2007/0099120 A1    May 3, 2007

Related U.S. Application Data

(62) Division of application No. 11/051,330, filed on Feb. 7, 2005.

(30) Foreign Application Priority Data

Feb. 5, 2004    (JP) ............... 2004-029171

(51) Int. Cl.
*G03F 7/32* (2006.01)
(52) U.S. Cl. .................... 430/302; 430/326
(58) Field of Classification Search ........... 430/302, 430/326
See application file for complete search history.

(56) References Cited

U.S. PATENT DOCUMENTS

| 3,272,628 | A | 9/1966 | Connolly et al. |
| 4,945,030 | A | 7/1990 | Turner et al. |
| 5,314,789 | A | 5/1994 | Hawkins et al. |
| 6,096,477 | A * | 8/2000 | Rahman et al. .......... 430/270.1 |
| 6,100,016 | A | 8/2000 | Denzinger et al. |
| 6,187,500 | B1 * | 2/2001 | Miyagi et al. ............... 430/166 |
| 6,391,530 | B1 | 5/2002 | Timpe et al. |
| 6,432,621 | B1 | 8/2002 | Nomoto et al. |
| 6,562,555 | B2 | 5/2003 | Fiebag et al. |
| 6,569,609 | B2 | 5/2003 | Timpe et al. |
| 6,575,094 | B2 | 6/2003 | Miwa et al. |
| 6,887,654 | B2 | 5/2005 | Lundy et al. |
| 2003/0108814 | A1 * | 6/2003 | Miyake et al. ........... 430/271.1 |
| 2003/0215754 | A1 | 11/2003 | Lundy et al. |

FOREIGN PATENT DOCUMENTS

| EP | 0 274 044 A1 | 7/1988 |
| EP | 1 253 472 A2 | 10/2002 |
| JP | 01-129250 A | 5/1989 |
| JP | 11-194504 A | 7/1999 |
| JP | 2001-242639 A | 9/2001 |
| JP | 2001-350261 A | 12/2001 |
| JP | 2003-015317 A | 1/2003 |
| JP | 2003-107683 A | 4/2003 |

* cited by examiner

*Primary Examiner*—Hoa V Le
(74) *Attorney, Agent, or Firm*—Buchanan Ingersoll & Rooney PC

(57) ABSTRACT

An alkaline developing solution for development of a presensitized plate for use in making a lithographic printing plate, which developing solution comprises a polyoxyalkylene adduct of alkylene diamine, a polyoxyalkylene compound having an acid radical, and an anionic surfactant; a method for making a lithographic printing plate comprising the steps of: light-exposing a presensitized plate for use in making a lithographic printing plate; and developing the light-exposed plate with an alkaline developing solution comprising a polyoxyalkylene adduct of alkylene diamine, a polyoxyalkylene compound having an acid radical, and an anionic surfactant.

9 Claims, No Drawings

DEVELOPING SOLUTION FOR LITHOGRAPHIC PRINTING PLATE PRECURSOR AND METHOD FOR MAKING LITHOGRAPHIC PRINTING PLATE

FIELD OF THE INVENTION

The present invention relates to an alkaline developing solution for use in processing a lithographic printing plate precursor, i.e., a presensitized plate for use in making a lithographic printing plate (hereinafter possibly referred to as "PS plate"), and further a method for making a lithographic printing plate using the alkaline developing solution. More particularly, the present invention relates to an alkaline developing solution which is suitable for making a lithographic printing plate from a PS plate capable of achieving direct plate making, that is, making a printing plate directly by exposing the PS plate to infrared laser scanning based on digital signals from computers or the like, and a method for making a lithographic printing plate using said alkaline developing solution.

BACKGROUND OF THE INVENTION

There have been great strides made in the study of laser in recent years. In particular, solid lasers and semiconductor lasers that can emit light of wavelengths ranging from the near infrared region to the infrared region are available in the form of high-powered, small-sized laser devices. Such laser devices are remarkably useful as the light sources for light exposure when printing plates are made by direct transfer of digital data from computers or the like to image forming materials.

Conventionally, a light-sensitive image forming material of a positive-working mode designed for direct plate making, which is used with infrared laser comprises, for example, a novolak resin as an alkali-soluble resin. For example, Japanese Patent Application Publication (hereunder referred to as "JP KOKAI") No. Hei 7-285275 discloses a light-sensitive image forming material of a positive-working mode. The above-mentioned image forming material comprises an alkali-soluble resin having a phenolic hydroxyl group, such as a novolak resin, to which are added light-sensitive compounds of positive-working mode, i.e., a material capable of generating heat after absorbing light, a variety of onium salts, and quinone diazide compounds. At a non-light exposed portion (which will serve as an image portion) in the image forming material, the above-mentioned light-sensitive compounds of positive-working mode serve as a dissolution blocking agent, in other words, work to substantially decrease the solubility of the alkali-soluble resin. At a light exposed portion (which will become a non-image portion), on the other hand, the light-sensitive compounds do not exhibit any dissolution blocking performance by the generation of heat, so that the image forming material is allowed to dissolve in a developing solution, to complete the removal of the image forming material at the non-image portion. Thus, image formation is achieved.

Further, there is proposed a light-sensitive image forming material of positive-working mode comprising a substance capable of absorbing light to generate heat and a resin of which the solubility in alkaline aqueous solutions is changeable depending upon the application of heat as disclosed, for example, in International Publication No. WO 97/39894 and EP-A-0823327. This type of image forming material can achieve image formation in such a manner that one portion of the image forming material corresponding to an image portion exhibits a low solubility in an alkaline aqueous solution, while the other portion which will be a non-image portion shows an increased solubility in the alkaline aqueous solution by the generation of heat, thereby readily allowing the portion corresponding to the non-image portion to be removed by development.

However, in the above lithographic printing plate precursor of positive-working mode for infrared laser scanning, there is a problem that it is difficult to make highly sharp and clear images, because a difference of dissolving rate in an alkaline developing solution between a light-exposed portion and an unexposed portion is small. Furthermore, in a heat-sensitive printing plate precursor as described above, there is a problem that excessive development or defective development tends to take place depending on variation of use conditions, since a difference between a resistance of dissolution residing in an unexposed portion (image portion) to a developing solution and a solubility of a light-exposed portion (non-image portion) in a developing solution is still insufficient in various use conditions. In addition, the image-forming ability of the lithographic printing plate precursor depends on a heat generation on the surface of an image recording layer through an infrared laser exposure, and in the vicinity of a substrate, quantity of heat which is used for dissolution of the image recording layer, i.e., for an image formation is small due to a dispersion of heat, resulting in that a difference between light-exposure and unexposure becomes small and a reproducibility of highlight becomes insufficient.

In consideration of the above problems, it has been proposed to add a specific compound, i.e., a development inhibitor to a developing solution composition, said compound preventing the image area on the lithographic printing plate from being etched, as described, for example, in JP KOKAI No. Hei 11-194504. Such a development inhibitor may interact with a compound dissolving from a light-sensitive layer into a developing solution, and then alkali-solubility of said compound dissolving from the light-sensitive layer is remarkably decreased to generate insoluble matter. Such insoluble matter becomes sludge in a processing bath for development, and when such sludge adheres to a non-image area of printing plate, said condition may cause scumming during printing. On the other hand, the development inhibitor is consumed through the interaction with the compound dissolving from a light-sensitive layer into a developing solution, resulting in that the advantages of inhibiting development by the development inhibitor is not maintained. Further, EP-A-0274044 has proposed an alkaline developing solution comprising ethyleneoxide/propyleneoxide block copolymer and optionally a phosphate ester and the like, and JP KOKAI 2001-242639 has proposed a technique that a specific phosphate ester compound is added to a developing solution composition to improve an ability of image formation. Though the above compounds are used, image forming performance or inhibition of occurrence of development sludge is not sufficiently accomplished.

In the art of image forming materials, a novolak resin is conventionally used preferably, and recently as a more preferable image forming material, a light-sensitive image forming material comprising a novolak resin comprising xylenol as a constituent monomer is proposed, for example, in JP KOKAI No. 2001-350261. The use of said novolak resin comprising xylenol as a constituent monomer can lead to an excellent time-lapse stability of the prepared lithographic printing plate precursor. On the other hand, the above-mentioned novolak resin containing as a monomer component xylenol shows a lower solubility in alkaline aqueous solutions as compared with the conventional novolak resins. Therefore, when this type of novolak resin is used for the image forming material, the image forming material constituting a non-image portion once dissolved in the developing solution tends to form insoluble matter in the developing solution. Such insoluble matter is accumulated and aggregated to form development sludge in the developing solution after repetition of the development steps, which becomes a factor that will make the development step unstable. To be more specific about the disadvantages caused by the above-mentioned phenomenon, the development sludge can be deposited on the resultant plate to impair the images formed thereon, and the development sludge which settles down and precipitates in a processing bath for development makes the maintenance of the processing bath more burdensome. In the case where the PS plate is subjected to a burning treatment, the development sludge, if still remaining on the non-image portion of the PS plate, will be carbonized, thereby resulting in scumming, in other words, staining the printed matter.

Thus, in making a lithographic printing plate, there has been required a method in which the occurrence of development sludge caused by a component of image recording layer and the like is inhibited, a highly sharp and clear image is formed without impairing the formed image areas, and stable development procedure and stable image formation are accomplished for a prolonged period.

SUMMARY OF THE INVENTION

Accordingly, an object of the present invention is to overcome the above conventional drawbacks and provide an alkaline developing solution which makes possible that a highly sharp and clear image is formed without damages to the formed image areas, and exhibits a certain performance and retains favorable image forming performance, even if components of an image recording layer dissolve into the developing solution in course of processing. An another object of the present invention is to provide an alkaline developing solution which can suppress the occurrence of development sludge originated from the component of an image recording layer. A further object of the present invention is to provide a method for making a lithographic printing plate wherein the above developing solution is used to carry out stable development procedure and stable image formation for a prolonged period.

The inventor of the present invention has intensively studied to achieve the above-mentioned object. As a result, it has been found that the use of specific compounds in combination in a developing solution makes possible that an image area on the plate during making a lithographic printing plate is sufficiently prevented from dissolving in a developing solution, such a development inhibiting effect is maintained to accomplish an image formation wherein the contrast between an image area and a non-image area is sufficient, and occurrence of the development sludge is inhibited. Thus the inventor has completed the present invention.

Further, it has been found that among the above specific compounds, the compound which may have a development inhibiting effect on image areas can be selected in terms of a molecular weight thereof, and such a compound is added to a developing solution to ensure more sufficient latitude in variation of development conditions in a plate making process, resulting in a longer-lasting stable development procedure.

Consequently, the present invention is directed to an alkaline developing solution for development of a presensitized plate for use in making a lithographic printing plate, which developing solution comprises a polyoxyalkylene adduct of alkylene diamine, a polyoxyalkylene compound having an acid radical, and an anionic surfactant. The alkaline developing solution of the present invention may comprise two or more of the polyoxyalkylene adduct of alkylene diamine. In a preferable embodiment, the polyoxyalkylene adduct of alkylene diamine having a molecular weight of not more than 2000 and the polyoxyalkylene adduct of alkylene diamine having a molecular weight of not less than 3000 are used together in the alkaline developing solution.

The present invention is further directed to a method for making a lithographic printing plate comprising the steps of: light-exposing a presensitized plate for use in making a lithographic printing plate; and developing the light-exposed plate with the above alkaline developing solution.

A type of the presensitized plate for use in making a lithographic printing plate to which the alkaline developing solution of the present invention is applied is not particularly limited.

A type of the presensitized plate to which the alkaline developing solution of the present invention is preferably applied includes a heat-sensitive presensitized plate of a positive-working mode for use in making a lithographic printing plate, said presensitized plate comprising a substrate and an image recording layer which is formed thereon and comprises a novolak resin containing xylenol as a monomer component and an infrared absorbing dye.

Accordingly, the present invention is also directed to a method for making a lithographic printing plate comprising the steps of: light-exposing to infrared radiation, a heat-sensitive presensitized plate of a positive-working mode for use in making a lithographic printing plate, said presensitized plate comprising a substrate and an image recording layer which is formed thereon and comprises a novolak resin containing xylenol as a monomer component and an infrared absorbing dye; and developing the light-exposed plate with the above alkaline developing solution.

According to the alkaline developing solution of the present invention, a highly sharp and clear image can be formed in a printing plate without damages to the formed image areas. The alkaline developing solution of the present invention can exhibit a certain performance and retain favorable image forming performance, even if components of an image recording layer dissolve into the developing solution in course of processing. Further, according to the alkaline developing solution of the present invention, occurrence of development sludge originated from the component of an image recording layer can be suppressed. Accordingly, a method for making a lithographic printing plate using the alkaline developing solution of the present invention makes it possible that stable development procedure and stable image formation are carried out for a prolonged period.

Since development performance according to the alkaline developing solution of the present invention is highly stable, stable development procedure can be carried out for a prolonged period with supplement of a replenisher having the same composition as those of the developing solution fed initially into a processing bath for development, and this condition can lead to reduction in costs of distribution and production of the products.

DETAILED DESCRIPTION OF THE INVENTION

The alkaline developing solution according to the present invention, which will also be hereinafter referred to as the developing solution simply, will now be explained in detail.

The developing solution of the present invention is an alkaline aqueous solution as a basic composition thereof, and it can appropriately be chosen from the conventional alkaline aqueous solutions.

The developing solutions of the present invention include an alkaline aqueous solution comprising an alkali silicate or a nonreducing sugar and a base. The alkaline developing solutions having a pH range from 12.5 to 14.0 are particularly preferable.

The above-mentioned alkali silicate shows alkaline properties when dissolved in water. For example, silicates of alkali metals such as sodium silicate, potassium silicate and lithium silicate, and ammonium silicate can be used. Such alkali silicates may be used alone or in combination.

The developing performance of the alkaline aqueous solution comprising the above-mentioned alkali silicate can easily be controlled by adjusting the mixing ratio of the components constituting the silicate, that is, silicon dioxide ($SiO_2$) and alkali oxide represented by $M_2O$, wherein M is an alkali metal or ammonium group, and the concentration of the alkali silicate.

In the above-mentioned alkaline aqueous solution, it is preferable that the molar ratio of the silicon dioxide ($SiO_2$) to the alkali oxide ($M_2O$) ($SiO_2/M_2O$: molar ratio) be in the range of 0.5 to 3.0, from the aspect of moderate alkalinity and developing performance, and more preferably 0.8 to 2.0.

The concentration of the alkali silicate in the developing solution is preferably in the range of 1 to 20% by weight from the aspect of developing performance, processing ability and waste fluid treatment, more preferably 3 to 15% by weight, and most preferably 4 to 10% by weight, with respect to the total weight of the alkaline aqueous solution.

In the developing solution comprising a nonreducing sugar and a base, the nonreducing sugars mean sugars having no reducing properties due to the absence of free aldehyde group and ketone group. The nonreducing sugars are classified into trehalose type oligosaccharides prepared by linking reducing groups together, glycosides prepared by joining a reducing group of sugars with non-sugars, and sugar alcohols prepared by reducing sugars with hydrogenation. Any of the above-mentioned nonreducing sugars can preferably be used in the present invention.

The trehalose type oligosaccharides include, for example, saccharose and trehalose; and the glycosides include, for example, alkyl glycoside, phenol glycoside, and mustard oil glycoside.

Examples of the sugar alcohols are D, L-arabitol, ribitol, xylitol, D, L-sorbitol, D, L-mannitol, D, L-iditol, D, L-talitol, meso-inositol, dulcitol, and allodulcitol. Further, maltitol obtained by subjecting disaccharides to hydrogenation and reductants (e.g., reduced starch syrup) obtained by subjecting oligosaccharides to hydrogenation are also preferred.

Among the above-mentioned nonreducing sugars, trehalose type oligosaccharides and sugar alcohols, in particular, saccharose, D-sorbitol and reduced starch syrup are preferably employed because there can be obtained a buffering action to lead to an adequate pH range.

Those nonreducing sugars may be used alone or in combination. The amount of the nonreducing sugar in the developing solution is preferably in the range of 0.1 to 30% by weight, more preferably 1 to 20% by weight.

The above-mentioned alkali silicate or nonreducing sugar can be used in combination with a base, which may appropriately be selected from the conventional alkaline chemicals, and a pH value of the developing solution can be adjusted.

Examples of the alkaline chemicals include inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

In addition to the above, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can also be used.

Those alkaline chemicals may be used alone or in combination.

Among the above-mentioned alkaline chemicals which are suitable are sodium hydroxide and potassium hydroxide. By controlling the amount of the alkaline chemicals such as sodium hydroxide and potassium hydroxide with respect to the nonreducing sugar, the pH value of the developing solution can be determined within a wide range. Further, sodium tertiary phosphate, potassium tertiary phosphate, sodium carbonate and potassium carbonate are also preferable, since they have themselves, buffering action.

[Polyoxyalkylene Adduct of Alkylene Diamine]

The alkaline developing solution according to the present invention comprises a polyoxyalkylene adduct of alkylene diamine. It is believed that said compound serves as a development inhibitor, i.e., said compound exhibits an effect of preventing an image portion during a development process in a lithographic printing plate making method from dissolving into the developing solution.

The polyoxyalkylene adduct of alkylene diamine which can be used in the present invention includes a compound represented by the following general formula (I):

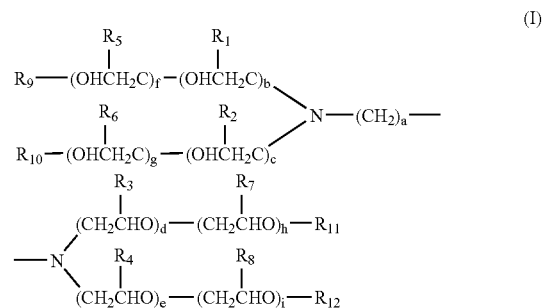

wherein $R_1$, $R_2$, $R_3$, $R_4$, $R_5$, $R_6$, $R_7$ and $R_8$ may be the same or different, and each independently represents H or —$CH_3$, and $R_9$, $R_{10}$, $R_{11}$, and $R_{12}$ may be the same or different, and each independently represents H, —$CH_3$, —$COR_{13}$ or —$CONHR_{14}$ (wherein each of $R_{13}$ and $R_{14}$ represents an alkyl, aryl, alkenyl or alkynyl group), a represents an integer of from 2 to 12, b, c, d, e, f, g, h and i may be the same or different, and each independently represents 0 or an integer of from 1 to 300, and $(b+f)(c+g)(d+h)(e+i) \neq 0$.

In the general formula (I), an alkyl group represented by $R_{13}$ or $R_{14}$ is preferably a linear chain or branched chain alkyl group having carbon atoms of from 1 to 25, such as $CH_3$—, $CH_3CH_2$—, $CH_3(CH_2)_2$—, $CH_3(CH_2)_3$—, $CH_3(CH_2)_4$—, $(CH_3)_2CH(CH_2)_2$—, $CH_3CH_2CH(CH_3)$—$CH_2$—, $CH_3(CH_2)_2CH(CH_3)$—, $CH_3(CH_2)_7$—, $CH_3(CH_2)_8$—, $CH_3(CH_2)_{10}$—, $CH_3(CH_2)_{12}$—, $CH_3(CH_2)_{14}$—, $CH_3(CH_2)_{16}$—, $CH_3(CH_2)_{18}$—, $CH_3(CH_2)_{20}$—, $CH_3(CH_2)_{22}$— and $CH_3(CH_2)_{24}$—.

In the general formula (I), an aryl group represented by $R_{13}$ or $R_{14}$ includes a monocyclic or bicyclic aryl group and those substituted by an alkyl group in the form of linear or branched chain, such as phenyl and the groups shown below.

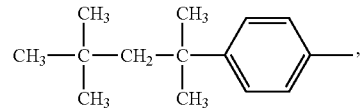

-continued

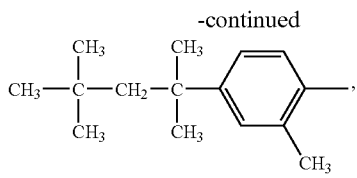

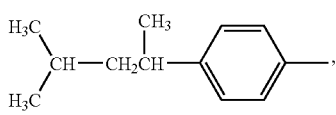

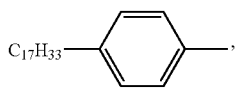, 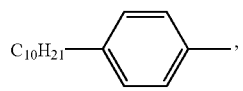

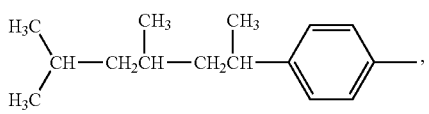

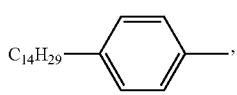, 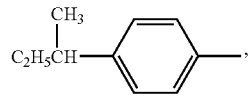

-continued

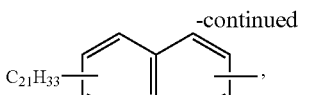

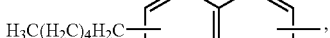

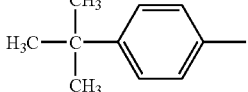

In the formula (I), an alkenyl or alkynyl group represented by $R_{13}$ or $R_{14}$ includes those having carbon atoms of from 9 to 24, such as $CH_2=CH(CH_2)_7-$, $CH_2CH_2CH=CH(CH_2)_7-$, $CH_3(CH_2)_5CH=CH-$, $CH_3(CH_2)_7CH=CH-$, $CH_3(CH_2)_5CH(OH)CH_2CH_2CH=CH(CH_2)_7-$, $CH_3(CH_2)_{10}CH=CH(CH_2)_4-$, $CH_3(CH_2)_5CH=CH(CH_2)_9-$, $CH_3(CH_2)_4CH=CHCH_2CH=CH(CH_2)_7$, $CH_3CH_2CH=CHCH_2CH=CHCH_2CH=CH(CH_2)_7-$, $CH_3(CH_2)_3(CH=CH)_3(CH_2)_7-$, $CH_3(CH_2)_8(CH=CH)_3(CH_2)_4CO(CH_2)_2-$, $CH_3(CH_2)_7C\equiv C(CH_2)_7-$, and $CH_3(CH_2)_9CH=CH(CH_2)_7-$.

The polyoxyalkylene adduct of alkylene diamine used in the present invention is preferably water-soluble.

Among the compound represented by the general formula (I), preferred is a compound wherein $R_1=R_2=R_3=R_4=CH_3$ and $R_5=R_6=R_7=R_8=H$, or $R_1=R_2=R_3=R_4=H$ and $R_5=R_6=R_7=R_8=CH_3$, and $R_9=R_{10}=R_{11}=R_{12}=H$ or $COR_{13}$ (wherein $R_{13}$=alkyl), the moiety of ethylene oxides represents from 40 to 80% by weight of the whole molecule, a molecular weight of the moiety of propylene oxides is from 500 to 7,000, and a is an integer of from 2 to 6. Among these, particularly preferred is a compound wherein $R_1=R_2=R_3=R_4=CH_3$, $R_5=R_6=R_7=R_8=H$, $R_9=R_{10}=R_{11}=R_{12}=H$ and a=2, or $R_1=R_2=R_3=R_4=H$, $R_5=R_6=R_7=R_8=CH_3$, $R_9=R_{10}=R_{11}=R_{12}=H$ and a=2, as represented below:

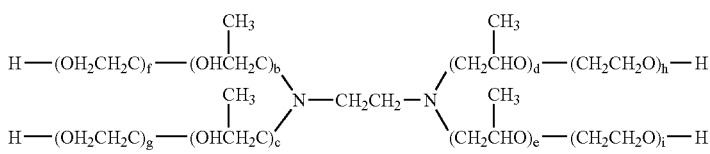

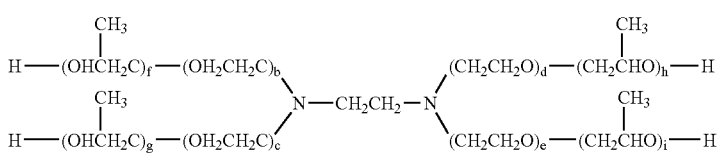

wherein none of b, c, d, e, f, g, h and i are zero.

In the developing solution, two or more of the polyoxyalkylene adducts of alkylene diamine are used.

The polyoxyalkylene adduct of alkylene diamine having a higher molecular weight is preferable from the viewpoint of image formation. On the other hand, the polyoxyalkylene adduct of alkylene diamine having a higher molecular weight tends to react with a compound dissolving from a light-sensitive layer into a developing solution so that insoluble matter occurs, and simultaneously the polyoxyalkylene adduct of alkylene diamine is consumed by the compound dissolving from a light-sensitive layer into a developing solution so that inhibition effect on development by the polyoxyalkylene adduct of alkylene diamine is reduced and then a development performance becomes widely varied.

According to the present invention, preferably a combination use of the polyoxyalkylene adduct of alkylene diamine having a molecular weight of not more than 2000 and the polyoxyalkylene adduct of alkylene diamine having a molecular weight of not less than 3000 in the developing solution makes it possible that image-forming ability, inhibition on occurrence of development sludge and inhibition on consumption of the polyoxyalkylene adduct of alkylene diamine are moderately balanced. More preferably, the polyoxyalkylene adduct of alkylene diamine having a molecular weight of not more than 2000 may be used in combination with the polyoxyalkylene adduct of alkylene diamine having a molecular weight of not less than 4000. Generally, the polyoxyalkylene adduct of alkylene diamine having a molecular weight of up to 30,000 may be used in the present invention.

As the polyoxyalkylene adduct of alkylene diamine used in the present invention, a commercial product may be used, and such a commercial product includes a product under a trade name of Tetronic and the like listed in brochures from BASF, ASAHI DENKA CO., LTD. and the like.

In the developing solution according to the present invention, the amount of the polyoxyalkylene adduct of alkylene diamine is generally from 0.001 to 10% by weight, preferably form 0.005 to 5% by weight and more preferably from 0.01 to 1.0% by weight. In case that the polyoxyalkylene adduct of alkylene diamine having a molecular weight of not more than 2000 and the polyoxyalkylene adduct of alkylene diamine having a molecular weight of not less than 3000 are used in combination, the former compound is used generally in the amount of 5 to 200 times that of the latter compound by weight.

[Polyoxyalkylene Compound Having Acid Radical]

The developing solution of the present invention further comprises a polyoxyalkylene compound having an acid radical. It is supposed that said polyoxyalkylene compound having an acid radical serves to inhibit the consumption of the above development inhibitor by a light-sensitive layer component dissolved into a developing solution, and contributes to continuation of the development inhibiting effect.

Examples of the polyoxyalkylene compound having an acid radical used in the present invention include the compound represented by the following general formula (II):

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, and Y represents a phosphate residue or a carboxylic acid residue.

The above compound represented by the general formula (II) wherein Y is a phosphate residue is specifically represented by the following formula (III):

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, and M represents independently a hydrogen atom, an alkali metal atom or an ammonium.

In the above formulas, R represents preferably an alkyl or alkenyl group having 1 to 30 carbon atoms which may have a substituent, an aromatic hydrocarbon group having 6 to 15 carbon atoms which may have a substituent, or a heteroaromatic group having 4 to 15 carbon atoms which may have a substituent. Examples of the substituent include an alkyl or alkenyl group having 1 to 20 carbon atoms, a halogen atom such as Br, Cl, I and the like, an aromatic hydrocarbon group having 6 to 15 carbon atoms, an aralkyl group having 7 to 17 carbon atoms, an alkoxy group having 1 to 20 carbon atoms, an alkoxy-carbonyl group having 2 to 20 carbon atoms, and an acyl group having 2 to 15 carbon atoms.

In the above formulas wherein R is an alkyl group, said alkyl group is preferably a linear or branched chain alkyl group having 6 to 30 carbon atoms, and among these, a linear chain alkyl group is preferable. Examples of the alkyl group include octyl group, decyl group, lauryl group, tridecyl group, myristyl group, cetyl group and stearyl group.

In the above formulas wherein R is an aromatic hydrocarbon group, said aromatic hydrocarbon group is preferably those having 6 to 15 carbon atoms, and examples thereof include phenyl group, alkylphenyl group, naphthyl group and alkylnaphthyl group. The alkali metal atom represented by M includes sodium, potassium and lithium.

Typical compounds represented by the formula (III) include polyoxyethylene alkylether phosphate and a salt of said phosphate (polyoxyethylene octylether phosphate, polyoxyethylene decylether phosphate, polyoxyethylene laurylether phosphate, polyoxyethylene tridecylether phosphate, polyoxyethylene myristylether phosphate, polyoxyethylene cetylether phosphate, polyoxyethylene stearylether phosphate, and the like), polyoxyethylene phenylether phosphate and a salt of said phosphate, polyoxyethylene alkylphenylether phosphate and a salt of said phosphate (polyoxyethylene methylphenylether phosphate, polyoxyethylene ethylphenylether phosphate, polyoxyethylene propylphenylether phosphate, polyoxyethylene butylphenylether phosphate, polyoxyethylene nonylphenylether phosphate, polyoxyethylene laurylphenylether phosphate, and the like), and polyoxyethylene alkylamide phosphate and a salt of said phosphate (polyoxyethylene octaneamide phosphate, polyoxyethylene decaneamide phosphate, polyoxyethylene dodecaneamide phosphate, polyoxyethylene tridecaneamide phosphate, polyoxyethylene tetradecaneamide phosphate, polyoxyethylene hexadecaneamide phosphate, polyoxyethylene octadecaneamide phosphate and the like).

The phosphate compounds represented by the above formula are generally available in market, and commercial products thereof include products manufactured by Dow Chemical Co., Ltd., Asahi Denka Co., Ltd., Nippon Nyukazai Co., Ltd., Dai-Ichi Kogyo Seiyaku Co., Ltd., Takemoto Oil and Fat Co., Ltd., Kawaken Fine Chemicals Co., Ltd., and BASA. The commercial products include those available as a mixture with a diester and/or a triester represented by the following formulas. The water-solubility of the above phosphate compound tends to be decreased in the presence of said diester and/or triester, or said diester and/or triester interacts with a light-sensitive layer component dissolving into a developing solution to cause occurrence of development sludge, and therefore the amount of said diester and/or triester is preferably not more than 1.0 mol per 1.0 mol of the above monoester compound represented by the formula (III), in the developing solution.

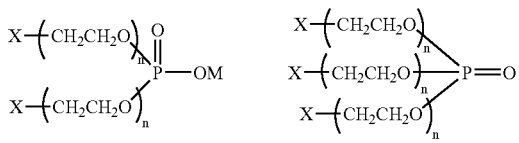

(wherein X, n and M are defined as described above.)

On the other hand, the compound represented by the general formula (II) wherein Y is a carboxyl acid residue is specifically represented by the following formula (IV):

$$X-(CH_2CH_2O)n-C_pH_{2p}-COOM \quad (IV)$$

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, p represents zero or an integer of from 1 to 30, and M represents independently a hydrogen atom, an alkali metal atom or an ammonium.

In the above formula (IV), R represents preferably an alkyl or alkenyl group having 1 to 30 carbon atoms which may have a substituent, an aromatic hydrocarbon group having 6 to 15 carbon atoms which may have a substituent, or a heteroaromatic group having 4 to 15 carbon atoms which may have a substituent. Examples of the substituent include an alkyl or alkenyl group having 1 to 20 carbon atoms, a halogen atom such as Br, Cl, I and the like, an aromatic hydrocarbon group having 6 to 15 carbon atoms, an aralkyl group having 7 to 17 carbon atoms, an alkoxy group having 1 to 20 carbon atoms, an alkoxy-carbonyl group having 2 to 20 carbon atoms, and an acyl group having 2 to 15 carbon atoms.

In the above formulas wherein R is an alkyl group, said alkyl group is preferably a linear or branched chain alkyl group having 6 to 30 carbon atoms, and among these, a linear chain alkyl group is preferable. Examples of the alkyl group include octyl group, decyl group, lauryl group, tridecyl group, myristyl group, cetyl group and stearyl group.

In the above formulas wherein R is an aromatic hydrocarbon group, said aromatic hydrocarbon group is preferably those having 6 to 15 carbon atoms, and examples thereof include phenyl group, alkylphenyl group, naphthyl group and alkylnaphthyl group. The alkali metal atom represented by M includes sodium, potassium and lithium.

Typical compounds represented by the formula (IV) include polyoxyethylene alkylether carboxylic acid and said carboxylic acid salt, polyoxyethylene alkylphenylether carboxylic acid and said carboxylic acid salt, and more specifically polyoxyethylene alkylether acetic acid, said acetic acid salt, polyoxyethylene alkylphenylether acetic acid, said acetic acid salt and the like.

The compounds represented by the formula (IV) are generally available in market, and commercial products thereof include products manufactured by Sanyo Chemical Industries Ltd., Nikko Chemicals Ltd., Dai-Ichi Kogyo Seiyaku Co., Ltd., and Lion Co., Ltd.

In the developing solution according to the present invention, the polyoxyalkylene compound having an acid radical may be used alone or in combination. In the developing solution, the amount of the polyoxyalkylene compound having an acid radical is in terms of effective component, generally from 0.01 to 20% by weight, preferably from 0.1 to 10% by weight, and more preferably from 0.2 to 5% by weight. The above mentioned amount of the polyoxyalkylene compound having an acid radical is suitable from the viewpoint of sufficiently inhibiting the development inhibitor from being consumed by an image recording layer component dissolving into the developing solution, and ensuring a development ability of non-image areas.

[Anionic Surfactant]

The developing solution of the present invention further comprises an anionic surfactant. The anionic surfactant serves to disperse insoluble matter occurring in the developing solution, and inhibit the occurrence of development sludge.

The anionic surfactants which can be used in the present invention preferably include fatty alcohol sulfuric ester salts such as sodium lauryl alcohol sulfate, ammonium lauryl alcohol sulfate and sodium octyl alcohol sulfate, alkyl aryl sulfonic acid salts such as isopropyl naphthalene sulfonic acid sodium salt, isobutyl naphthalene sulfonic acid sodium salt, dodecyl benzene sulfonic acid sodium salt and meta-nitro benzene sulfonic acid sodium salt, sulfuric esters of fatty alcohol having carbon atoms of from 8 to 22 such as sodium secondary alkyl sulfate, aliphatic alcohol phosphoric ester salts such as sodium cetyl alcohol phosphate, alkyl amide sulfonic acid salts such as $C_{17}H_{33}CON(CH_3)CH_2CH_2SO_3Na$, sulfonic acid salts of bibasic aliphatic ester such as dioctyl sodium sulfosuccinate and dihexyl sodium sulfosuccinate, hydroxyalkane sulfonic acid salts, alkane sulfonic acid salts, alkyl diphenylether sulfonic acid salts, diphenylether disulfonic acid salts represented by the following general formula, dialkyl sulfosuccinate salts, olefin sulfonic acid salts, linear alkyl benzene sulfonic acid salts, branched alkyl benzene sulfonic acid salts, alkyl naphthalene sulfonic acid salts, alkyl phenoxy polyoxyethylene propyl sulfonic acid salts, polyoxyethylene alkyl sulfophenylether salts, disodium N-alkyl sulfosuccinate monoamides, petroleum sulfonic acid salts, and the like.

Among these, preferred are the diphenylether disulfonic acid salts represented by the following formula.

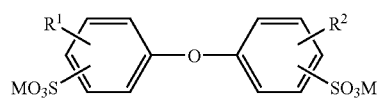

wherein $R^1$ and $R^2$ independently represent hydrogen atom or an alkyl group which may be in the form of branched chain, and M represents a monovalent alkali metal.

The alkyl group represented by $R^1$ or $R^2$ is preferably the one having carbon atoms of from 1 to 40, preferably from 4 to 20, and examples thereof include $nC_8H_{17}$, $nC_{12}H_{25}$ and the like. The alkali metal represented by M may be any alkali metal, and preferred are sodium, potassium and lithium.

The anionic surfactant preferably used in the present invention includes the following compounds.

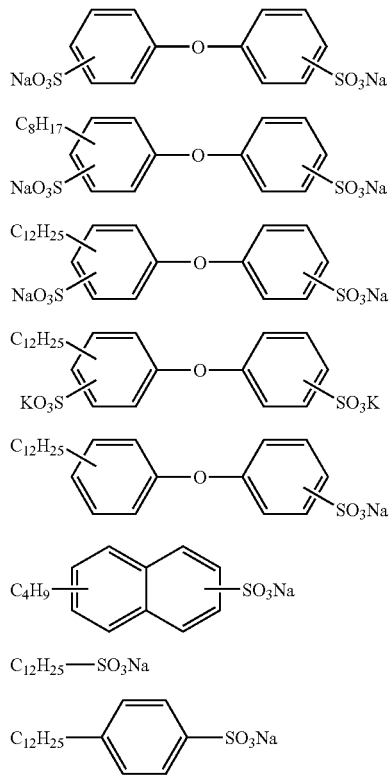

In the developing solution of the present invention, any one compound or any combination of two or more compounds selected from anionic surfactants may be used. The amount of the anionic surfactant in the developing solution ranges suitably from 0.001 to 20% by weight in terms of effective component.

The alkaline developing solution may further comprise various additives as shown below in order to enhance the developing performance more effectively.

The additives include, for example, a neutral salt such as NaCl, KCl and KBr as disclosed in JP KOKAI No. Sho 58-75152, a chelating agent such as EDTA and NTA as disclosed in JP KOKAI No. Sho 58-190952; a complex such as [Co(NH$_3$)$_6$]Cl$_3$ and CoCl$_2$.6H$_2$O as disclosed in JP KOKAI No. Sho 59-121336; anion or amphoteric surfactants such as sodium alkyl naphthalene sulfonate, N-tetradecyl-N,N-dihydroxyethyl betaine and the like as disclosed in JP KOKAI No. Sho 50-51324; a nonionic surfactant such as tetramethyldecyne diol as disclosed in U.S. Pat. No. 4,374,920; a cationic polymer such as methyl chloride quaternary compounds of p-dimethylaminomethyl polystyrene as disclosed in JP KOKAI No. Sho 55-95946; a polymeric ampholyte such as a copolymer of vinylbenzyltrimethylammonium chloride and sodium acrylate as disclosed in JP KOKAI No. Sho 56-142528; a reducing inorganic salt such as sodium sulfite as disclosed in JP KOKAI No. Sho 57-192951; an inorganic lithium compound such as lithium chloride as disclosed in JP KOKAI No. Sho 58-59444; an organic metal-containing surfactant such as surfactants containing organic silicon or titanium as disclosed in JP KOKAI No. Sho 59-75255; an organic boron compound as disclosed in JP KOKAI No. Sho 59-84241; and a quaternary ammonium salt such as tetraalkylammonium oxide as disclosed in EP 101,010.

The embodiment where the alkaline developing solution is used in the plate making method according to the present invention is not particularly limited. To rationalize and standardize the process of making a printing plate in the fields of plate making and printing, automatic processors have widely been used to produce printing plates in recent years. Typically, the automatic processor comprises a development unit and a post-treatment unit, including an apparatus for transporting a PS plate, containers for various kinds of treatment liquids, and apparatuses for spraying the liquids onto the PS plate. While the PS plate that has been exposed to light image is horizontally transported in the automatic processor, each treatment liquid is drawn up from the container using a pump and sprayed onto the PS plate through the spray nozzle, thereby achieving the development. There is also known a method of treating the PS plate by immersing the PS plate in a treatment liquid held in the container while transporting the PS plate along a guide roll provided in the container.

Such an automatic processor can achieve continuous development operation by replenishing the treatment liquids in respective containers according to the amount consumed and the operating time. In the plate making method according to the present invention, the above-mentioned replenishing system is preferably used, because large quantities of PS plates can be treated without any replacement of the developing solution in a developer container over a long period of time by adding a replenisher to the developing solution. Conventionally, an aqueous solution having a higher alkalinity than those of the developing solution fed initially into a developer container is often used as the replenisher, which replenisher is added to the developing solution. In the plate making method of the present invention, a replenisher controlled to have an alkalinity higher than that of the initial developing solution may be used. However, in the plate making method of the present invention, the replenisher having the same formulation as that of the initial developing solution can be used to carry out a stable processing treatment for a long period of time, since the developing solution according to the present invention can achieve a stable development treatment. This condition can lead to reduction in cost of distribution and production cost.

The aforementioned developing solution and replenisher therefor may further comprise diverse surfactants and organic solvents, if necessary, in order to appropriately control the developing performance, enhance the dispersion properties of sludge in the developing solution, and increase the ink receptivity of the image portion to be formed in the printing plate.

Such surfactant may be selected from nonionic, cationic, anionic or amphoteric surfactants other than those described above. Examples of nonionic surfactants include polyethylene glycols such as polyethylene glycol, polyethylene glycol-polypropylene glycol block copolymer and the like; polyethylene glycol alkyl ethers such as polyethylene glycol cetyl ether, polyethylene glycol stearyl ether, polyethylene glycol oleyl ether, polyethylene glycol behenyl ether and the like; polyethylene glycol polypropylene glycol alkyl ethers such as polyethylene glycol polypropylene glycol cetyl ether, polyethylene glycol polypropylene glycol decyl tetradecyl ether and the like; polyethylene glycol alkylphenyl ethers such as polyethylene glycol octylphenyl ether, polyethylene glycol nonylphenyl ether and the like; ethylene glycol fatty acid esters such as ethylene glycol monostearate, ethylene glycol distearate, diethylene glycol stearate, polyethylene glycol distearate, polyethylene glycol monolaurate, polyethylene glycol monostearate, polyethylene glycol monooleate and the like; glyceryl fatty acid esters such as glyceryl monomyristate, glyceryl monostearate, glyceryl monoisostearate, glyceryl distearate, glyceryl monooleate, glyceryl dioleate and the like, and polyethylene oxide adduct thereof; sorbitan fatty acid esters such as sorbitan monopalmitate, sorbitan monostearate, sorbitan tristearate, sorbitan monooleate, sorbitan trioleate and the like, and polyethylene oxide adduct thereof; sorbitol fatty acid esters such as sorbitol monolaurate, sorbitol tetrastearate, sorbitol hexastearate, sorbitol tetraoleate and the like, and polyethylene oxide adduct thereof; and polyethylene oxide adduct of caster oil, and the like.

Benzyl alcohol or the like is preferred as the above-mentioned organic solvent. In addition, it is also preferable to add polyethylene glycol or derivatives thereof, and polypropylene glycol or derivatives thereof.

Furthermore, when necessary, the developing solution and replenisher may comprise hydroquinone, resorcin, an inorganic salt type reducing agent such as sodium sulfite or hydrogensulfite and potassium sulfite or hydrogensulfite, an organic carboxylic acid, an antifoaming agent, and a water softener.

The PS plate which has undergone development process with the alkaline developing solution and replenisher is subjected to a post-treatment such as a water washing treatment, a treatment with a rinsing solution comprising a surfactant, and a treatment with a desensitizing solution comprising gum arabic, a starch derivative and the like. In the post treatment, the diverse treatments described above may be employed in combination.

In the method of making a printing plate according to the present invention, the development process using only a substantially fresh developing solution, that is, a throwaway developing solution, also can be employed.

The PS plate to which the alkaline developing solution according to the present invention may be applied is not particularly limited, and the PS plate includes various kinds of lithographic printing plate precursors which comprise a substrate and an image recording layer formed thereon, the image recording layer being a photo-sensitive layer or a heat-sensitive layer. The various PS plates include preferably a conventional PS plate of positive-working mode, a conventional PS plate of negative-working mode, a PS plate of photopolymerizable type, a thermal PS plate of positive-working mode, and a thermal PS plate of negative-working mode (including a thermal polymerization type and an acid cross-linking type), depending on the variety of image recording layer. The conventional PS plates herein used mean PS plates for conventional lithographic printing process where light exposure is imagewise conducted through a transparent positive and a transparent negative. The above-mentioned PS plates will be now explained briefly in terms of the respective image recording.

[Conventional PS Plate of Positive-Working Mode]

A composition comprising o-quinonediazide compound and an alkali-soluble polymer compound is one of the preferable photosensitive resin compositions for use in the conventional PS plate of positive-working mode. Examples of the o-quinonediazide compound include esters of 1,2-naphthoquinone-2-diazide-5-sulfonyl chloride and phenol-formaldehyde resin or cresol-formaldehyde resin, and esters of 1,2-naphthoquinone-2-diazide-5-sulfonyl chloride and pyrogallol-acetone resin (disclosed in U.S. Pat. No. 3,635,709). As the alkali-soluble polymer compound, for example, there are phenol-formaldehyde resin, cresol-formaldehyde resin, phenol-cresol-formaldehyde co-condensation resin, polyhydroxystyrene, N-(4-hydroxyphenyl)methacrylamide copolymer, and a carboxyl group-containing polymer disclosed in JP KOKAI No. Hei 7-36184. Furthermore, other alkali-soluble polymer compounds, for example, a phenolic hydroxyl group-containing acrylic resin as described in JP KOKAI No. Sho 51-34711, a sulfonamide group-containing acrylic resin as described in JP KOKAI No. Hei 2-866, and various urethane resins can also be employed. In addition, the photosensitive resin composition may preferably comprise a sensitivity controlling agent, a printing-out agent, and a dye as disclosed in JP KOKAI No. Hei 7-92660 (paragraphs from [0024] to [0027]), and a surfactant for enhancing the coating properties as shown in the paragraph [0031] of JP KOKAI No. Hei 7-92660.

[Conventional PS Plate of Negative-Working Mode]

There can be employed a photosensitive resin composition of a diazo resin and an alkali-soluble or alkali-swellable polymer compound serving as a binder agent for the conventional PS plate of negative-working mode.

Examples of the diazo resin are a condensation product of an aromatic diazonium salt and an active carbonyl group-containing compound such as formaldehyde, and an organic solvent-soluble diazo resin inorganic salt, that is, a reaction product of a condensation product of p-diazophenylamine and formaldehyde with hexafluorophosphate or tetrafluoroborate. In particular, a high-molecular weight diazo compound containing a hexamer or more in an amount of 20 mol % or more, as disclosed in JP KOKAI No. Sho 59-78340, is preferably used. Preferable examples of the binder agent are copolymers including as an indispensable component acrylic acid, methacrylic acid, crotonic acid, or maleic acid, for example, copolymers comprising a monomer such as 2-hydroxyethyl (meth)acrylate, (meth)acrylonitrile, and (meth)acrylic acid as disclosed in JP KOKAI No. Sho 50-118802; and copolymers comprising alkylacrylate, (meth)acrylonitrile, and unsaturated carboxylic acid as disclosed in JP KOKAI No. Sho 56-4144. It is preferable that the photosensitive resin composition further comprise, as shown in JP KOKAI No. Hei 7-281425 (paragraphs from [0014] to [0015]), a printing-out agent, a dye, a plasticizer for improving the flexibility and wear resistance of a coated film of the image recording layer, a development accelerator, and a surfactant for enhancing the coating properties.

The above-mentioned conventional PS plate of positive-working mode or negative-working mode may further comprise an intermediate layer which is interposed between the substrate and the photosensitive image recording layer. In this case, it is preferable to provide the intermediate layer comprising a polymer compound comprising an acid radical-containing constituent and an onium radical-containing constituent, as stated in JP KOKAI No. 2000-105462.

[PS Plate of Photopolymerizable Type]

(Photosensitive Image Recording Layer)

The photosensitive image recording layer of the PS plate of photopolymerizable type comprises a photosensitive photopolymerizable composition (which will be hereinafter referred to as "a photopolymerizable composition"), which comprises as the indispensable components an addition-polymerizable compound having an ethylenically unsaturated bond, a photopolymerization initiator, and a polymeric binder agent. The above-mentioned photopolymerizable composition may further comprise a variety of compounds serving as, for example, a coloring agent, a plasticizer, and a thermal polymerization inhibitor, if necessary.

The ethylenically unsaturated bond-containing compound for use in the photopolymerizable composition initiates addition polymerization by the action of the photopolymerization initiator when the photopolymerizable composition is exposed to active light, and is hardened by cross-linking. The ethylenically unsaturated bond-containing compound can be selected freely from the group consisting of compounds having at least one, preferably two or more terminal ethylenically unsaturated bonds. The aforementioned compounds may be, for example, in any form such as a monomer, a prepolymer including a dimmer, trimer and oligomer, or a mixture and copolymer thereof. Examples of the aforementioned monomer include esters of unsaturated carboxylic acids such as acrylic acid, methacrylic acid, itaconic acid, crotonic acid, isocrotonic acid, and maleic acid with aliphatic polyhydric alcohol compounds, and amides of the unsaturated carboxylic acids with aliphatic polyvalent amine compounds. Urethane based addition-polymerizable compounds are also preferable.

Depending upon the wavelength of light emitting from the employed light source, the photopolymerization initiator may appropriately be chosen from a variety of photopolymerization initiators, or two or more polymerization initiators may be used in combination to prepare a combined initiator system. For example, the initiator system disclosed in JP KOKAI No. 2001-22079 (paragraphs from [0021] to [0023]) is preferable.

The polymeric binder agent for use in the photopolymerizable composition is an organic high-molecular weight compound that is soluble or swellable in an aqueous alkaline solution because not only the polymer has to work as a film-forming agent for the photopolymerizable composition, but also the obtained photosensitive layer is required to be soluble in an alkaline developing solution. Preferable examples of the polymeric binder agent are shown in JP KOKAI No. 2001-22079 (paragraphs from [0036] to [0063]).

Moreover, the photopolymerizable composition may further comprise additives, for example, a surfactant for enhancing the coating properties, as shown in JP KOKAI No. 2001-22079 (paragraphs from [0079] to [0088]).

Further, it is preferable that a protective layer such as an oxygen barrier layer be provided on the photosensitive image recording layer to prevent the effect of the polymerization by oxygen. The oxygen barrier layer may comprise a polymer such as polyvinyl alcohol or copolymers thereof. Furthermore, an intermediate layer or adhesive layer as shown in JP KOKAI No. 2001-228608 (paragraphs from [0124] to [0165]) may be preferably provided under the photosensitive image recording layer of a photopolymerizable type.

[Thermal PS Plate of Positive-Working Mode]

(Heat-Sensitive Image Recording Layer)

The heat-sensitive image recording layer of a thermal PS plate of positive-working mode comprises an alkali-soluble polymer and a light-to-heat converter material. The alkali-soluble polymer is a homopolymer prepared from a monomer containing an acidic group, a copolymer comprising the above-mentioned monomer, and a mixture thereof. In light of the solubility in the employed alkaline developing solution, the alkali-soluble polymer comprising an acidic group such as (1) phenolic hydroxyl group (—Ar—OH) or (2) sulfonamide group (—SO$_2$NH—R) is preferable. In particular, the phenolic hydroxyl group is preferably employed in the alkali-soluble polymer because of the advantage in image forming performance by the image exposure using infrared laser beams or the Like. Therefore, novolak resins such as phenol-formaldehyde resin, m-cresol-formaldehyde resin, p-cresol-formaldehyde resin, (mixture of m-cresol and p-cresol)-formaldehyde resin, and (mixture of phenol and cresol (m-cresol and/or p-cresol))-formaldehyde resin; and pyrogallolacetone resin are preferably used as the alkali-soluble polymer. Other polymers disclosed in JP KOKAI No. 2001-305722 (paragraphs from [0023] to [0042]) are preferably employed.

In the heat-sensitive layer of the thermal PS plate of positive-working mode, a portion not exposed to light is in such a state that is not soluble in the alkaline developing solution due to the interaction between the above-mentioned alkali-soluble polymer and the light-to-heat converter material. At a portion exposed to light, the light-to-heat converter material works to convert the light energy into thermal energy to set free the above-mentioned interaction efficiently, so that the light-exposed portion becomes soluble in the alkaline developing solution. In consideration of the recording sensitivity, pigments and dyes having absorption within the infrared region with wavelengths of 700 to 1200 nm are preferably used as the light-to-heat converter material. Specific examples of the above-mentioned dyes include azo dyes, metal complex salt azo dyes, pyrazoloneazo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes such as nickel thiolate complex. Of those dyes, cyanine dyes are preferable, in particular, cyanine dyes represented by formula (I) in JP KOKAI No. 2001-305722 are preferably used.

The composition for use in the thermal PS plate of positive-working mode may further comprise the same sensitivity controlling agent, printing-out agent, dye, and surfactant for improving the coating properties as used in the above-mentioned conventional PS plate of positive-working mode. More specifically, the compounds shown in JP KOKAI No. 2001-305722 (paragraphs from [0053] to [0059]) are preferably employed.

The heat-sensitive image recording layer of the thermal PS plate of positive-working mode may have a single layered structure or a two-layered structure as described, for example, in JP KOKAI No. Hei 11-218914.

In the thermal PS plate of positive-working mode, an undercoating layer may be preferably provided between the substrate and the heat-sensitive image recording layer. A variety of organic compounds as shown in JP KOKAI No. 2001-305722 (paragraph [0068]) can be used for the undercoating layer.

[Thermal PS Plate of Negative-Working Mode]

(Heat-Sensitive Image Recording Layer)

In the heat-sensitive image recording layer of the thermal PS plate of negative-working mode, a portion exposed to infrared radiation is cured to form an image portion.

For example, a heat-sensitive layer of polymerization type is suitable for the thermal PS plate of negative-working mode. Such a polymerizable layer comprises (A) an infrared absorption agent, (B) a radical generator (radical polymerization initiator), (C) a radical-polymerizable compound which causes a polymerization reaction by the action of a radical generated by the radical generator (B) to cure, and (D) a binder polymer.

In the polymerizable layer, infrared radiation absorbed by the infrared absorption agent is converted into thermal energy, which decomposes the radical polymerization initiator such as an onium salt to generate a radical. The radical thus generated induces a chain reaction of polymerization of the radical-polymerizable compound that is selected from the group consisting of compounds having a terminal ethylenically unsaturated bond, so that the portion exposed to infrared radiation becomes cured.

As the infrared absorption agent (A), for example, the previously mentioned light-to-heat converter material for use in the heat-sensitive image recording layer of the thermal PS plate of positive-working mode can be used. In particular, cyanine dyes as mentioned in JP KOKAI No. 2001-133969 (paragraphs from [0017] to [0019]) can be preferably used. Onium salts can be used as the radical generator (B), and specific examples of the onium salts preferably used are shown in JP KOKAI No. 2001-133969 (paragraphs from [0030] to [0033]). The radical-polymerizable compound (C) can be selected from the group consisting of compounds having at least one, preferably two or more terminal ethylenically unsaturated bonds. With respect to the binder polymer (D), organic linear polymers are preferable, in particular, organic linear polymers that are soluble or swellable in water or a weak alkaline aqueous solution are preferably chosen. Especially, (meth)acrylic resins having benzyl group or allyl group and carboxyl group on the side chain thereof are suitable because such (meth)acrylic resins can offer an excellent balance of film-strength, sensitivity, and developing performance. Specific examples of the radical-polymerizable compound (C) and the binder polymer (D) are shown in JP KOKAI No. 2001-133969 (paragraphs from [0036] to [0060]) in detail. Other additives, for example, a surfactant for achieving better coating properties may be contained as shown in JP KOKAI No. 2001-133969 (paragraphs from [0061] to [0068]).

In addition to the above-mentioned polymerizable layer, a heat-sensitive image recording layer of acid cross-linking type is preferably used for the thermal PS plate of negative-working mode. The image recording layer of acid cross-linking type comprises (E) a compound capable of generating an acid by the application of light or heat, which compound will be hereinafter referred to as "an acid generator", (F) a compound that causes cross-linking by the action of the acid generated, which compound will be hereinafter referred to as "a cross-linking agent", and (G) an alkali-soluble polymer that is reactive to the cross-linking agent (F) under the presence of the acid. In order to make the most efficient use of the energy of infrared laser, the acid cross-linking layer may further comprise the previously mentioned infrared absorption agent (A).

As the acid generator (E), there can be employed compounds that can be thermally decomposed to generate an acid, such as a photopolymerization initiator, a light color change agent such as a dyestuff, and an acid generator for use in a micro resist. Examples of the cross-linking agent (F) include (i) an aromatic compound having as a substituent a hydroxymethyl group or alkoxymethyl group, (ii) a compound having a N-hydroxymethyl group, N-alkoxymethyl group, or N-acyloxymethyl group, and (iii) an epoxy compound. As the alkali-soluble polymer (G), novolak resins and polymers having a hydroxyaryl group in the side chain thereof can be employed.

[Back-Coating Layer]

In the PS plate thus obtained by providing a diverse image recording layer on a substrate, a coating layer may be optionally provided on a backside of the precursor to prevent an image recording layer from being damaged when the precursors are overlapped each other. Such a coating layer may be referred to as a back-coating layer and may consist of organic polymeric compounds.

[Light Exposure]

The PS plate is subjected to imagewise light exposure by a treating method according to the image recording layer thereof.

The light source capable of emitting the active light for achieving the light exposure includes, for example, mercury lamp, metal halide lamp, xenon lamp, and chemical lamp. A laser beam includes helium-neon laser (He—Ne laser), argon laser, krypton laser, helium-cadmium laser, KrF excimer laser, semiconductor laser, YAG laser, YAG-SHG laser and the like.

A type of the presensitized plate to which the alkaline developing solution of the present invention is preferably applied includes a heat-sensitive PS plate of positive-working mode wherein an image recording layer comprising a novolak resin containing xylenol as a monomer component and an infrared absorbing dye (IR-absorbing dye) is provided on a substrate.

Then, the constitution of the heat-sensitive PS plate of positive-working mode will hereunder be described in detail below.

[Novolak Resin Containing Xylenol Monomer]

The novolak resin containing xylenol as a monomer component (hereinafter referred to as xylenol-containing novolak resin), which is used for preparing the image recording layer of the heat-sensitive PS plate of positive-working mode, can be synthesized in accordance with the conventional reaction scheme by reacting phenol with formaldehyde in the presence of an acidic catalyst at atmospheric pressure. The novolak resin for use in the present invention is characterized in that xylenol is used as a starting monomer instead of, or in addition to phenol and/or cresol.

For xylenol used in the novolak resin, any structure can be selected from the six xylenol isomers. Particularly, 3,5-xylenol, 2,3-xylenol, 2,5-xylenol and 3,4-xylenol, which have relatively high melting points, are preferred to improve the stability of the obtained image recording material. Further, it is preferable that the xylenol-containing novolak resin for use in the present invention have a weight-average molecular weight of 500 to 10,000 in consideration of the improvement of printing durability and development performance.

The content of the xylenol monomer used for the preparation of the novolak resin is not particularly limited. The effect of enhancing the long-term stability can be obtained even by a slight content of xylenol monomer, and such an effect can be promoted as the content of xylenol is increased. When the content of the xylenol monomer in the novolak resin is expressed by "X % by weight" and the amount of the xylenol-containing novolak resin in the alkali-soluble resins constituting the image recording layer of the PS plate is expressed by "Y % by weight", it is preferable that the product of X and Y values be 500 or more, that is, the equation: X×Y□500 be established. When the alkali-soluble resin consists of the xylenol-containing novolak resin, that is, Y=100% by weight, the xylenol may preferably be contained in an amount of 5% by weight or more in the novolak resin to obtain the desired effect. Although there is observed a tendency of reduction in development performance with the increase in the amount of xylenol in the novolak resin, image formation can be recovered adequately by controlling the activity of the employed developing solution. In addition, there is another tendency to upgrade the printing durability with the reduction of development performance, so that the content of xylenol may appropriately be adjusted depending upon the characteristics required of the PS plate for lithographic printing.

It is preferable that the above-mentioned xylenol-containing novolak resin be contained in an amount of 10 to 99% by weight, more preferably 15 to 95% by weight, and most preferably 20) to 90% by weight, with respect to the total solid content of the image recording layer. The above-mentioned range is considered to be appropriate from the aspects of both the durability and the sensitivity of the image recording layer. When the binder used for preparation of the image recording layer comprises the above-mentioned xylenol-containing novolak resin and any other alkali-soluble resins than the xylenol-containing novolak resin, which will be explained later, it is desirable that the amount of the binder with respect to the total solid content of the image recording layer be within the above-mentioned range.

[Other Alkali-Soluble Resins than Xylenol-Containing Novolak Resin]

The particular novolak resin as mentioned above is essential as a binder component for use in the image recording layer. Other alkali-soluble resins may be used in combination with the above-mentioned novolak resin as far as the effect obtained by the xylenol-containing novolak resin will not be impaired. Such alkali-soluble resins that can be used in combination with the xylenol-containing novolak resin include a variety of alkali-soluble polymeric compounds, for example, general-purpose novolak resins free of a xylenol monomer conventionally known in the art, phenolic modified xylene resin, polyhydroxystyrene, polyhalogenated hydroxystyrene, an acrylic resin having phenolic hydroxyl group as disclosed in JP KOKAI No. Sho 51-34711, an acrylic resin having sulfonamide group as disclosed in JP KOKAI No. Hei 2-866, a variety of urethane resins, and so on.

The general-purpose novolak resins with a weight-average molecular weight of about 12,000 or less include the conventional novolak resins, for example, phenol-formaldehyde resins and cresol-formaldehyde resins such as m-cresol-formaldehyde resin, p-cresol-formaldehyde resin, o-cresol-formaldehyde resin, m-/p-cresol-formaldehyde resin, and mixture of phenol and cresol (m-, p-, o-, m-/p-, m-/o- or o-/p-cresol)-formaldehyde resin.

Preferable examples of the urethane resins are those as described in JP KOKAI Nos. Sho 63-124047, Sho 63-261350, Sho 63-287942, Sho 63-287943, Sho 63-287944, Sho 63-287946, Sho 63-287947, Sho 63-287948, Sho 63-287949, Hei 1-134354 and Hei 1-255854.

Particularly preferable alkali-soluble resins used in combination with the xylenol-containing novolak resin include polymeric compounds having in the molecule thereof a functional group selected from the group consisting of (a-1) phenolic hydroxyl group, (a-2) sulfonamide group, and (a-3) active imide group. Specific examples are as follows.

Examples of the polymeric compounds having phenolic hydroxyl group (a-1) include novolak resins such as phenol-formaldehyde resin, m-cresol-formaldehyde resin, p-cresol-formaldehyde resin, m- and p-mixed cresol-formaldehyde resin, and mixture of phenol and cresol (m-, p- or m-/p-cresol)-formaldehyde resin, and pyrogallol-acetone resin. In addition to the above, the use of polymeric compounds having a phenolic hydroxyl group in the side chain thereof is preferable. Such polymeric compounds having a phenolic hydroxyl group in the side chain thereof can include polymeric compounds prepared by subjecting a polymerizable monomer consisting of a low-molecular weight compound having at least one phenolic hydroxyl group and at least one polymerizable unsaturated bond to homopolymerization or copolymerization with other polymerizable monomers.

The polymerizable monomer having phenolic hydroxyl group includes acrylamide, methacrylamide, acrylic ester, methacrylic ester, and hydroxystyrene, each having a phenolic hydroxyl group. More specifically, preferably used are N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate. The resins having a phenolic hydroxyl group may be used in combination. Further, copolymers of phenol having as a substituent an alkyl group having 3 to 8 carbon atoms with formaldehyde, such as t-butyl phenol-formaldehyde resin and octyl phenol-formaldehyde resin as disclosed in U.S. Pat. No. 4,123,279 may be used in combination.

Examples of the polymeric compounds having sulfonamide group (a-2) include those prepared by subjecting a polymerizable monomer having sulfonamide group to homopolymerization or copolymerization with other polymerizable monomers. Such a polymerizable monomer having sulfonamide group includes a polymerizable monomer consisting of a low-molecular weight compound having in the molecule thereof at least one sulfonamide group (—NH—SO$_2$—) wherein at least one hydrogen atom is bonded to nitrogen atom, and at least one polymerizable unsaturated bond. In particular, preferably used are low-molecular weight compounds having acryloyl group, allyl group or vinyloxy group in combination with poly- or mono-substituted aminosulfonyl group or substituted sulfonylimino group.

With respect to the polymeric compounds (a-3), those having active imide group in the molecule thereof are preferred. Examples of those compounds include polymeric compounds prepared by subjecting a polymerizable monomer consisting of a low-molecular weight compound having in the molecule thereof at least one active imide group and at least one polymerizable unsaturated bond to homopolymerization or copolymerization with other polymerizable monomers.

Specific examples of the polymeric compounds (a-3) include N-(p-toluenesulfonyl)methacrylamide and N-(p-toluenesulfonyl)acrylamide, which can be preferably used in the present invention.

Furthermore, to obtain other alkali-soluble resins than the xylenol-containing novolak resin for use in the image recording layer, there can be preferably employed polymeric compounds prepared by copolymerizing two or more polymerizable monomers selected from the above-mentioned polymerizable monomers having a phenolic hydroxyl group, sulfonamide group and active imide group, or copolymerizing the above-mentioned two or more polymerizable monomers with other polymerizable monomers. In the case where the polymerizable monomer having a phenolic hydroxyl group is copolymerized with the polymerizable monomer having sulfonamide group and/or the polymerizable monomer having active imide group, it is preferable that the ratio by weight of the monomer having a phenolic hydroxyl group to the monomer having sulfonamide group and/or the monomer having active imide group be in the range of (50:50) to (5:95), preferably in the range of (40:60) to (10:90).

In the case where a copolymer of the polymerizable monomer having a phenolic hydroxyl group, sulfonamide group or active imide group with other polymerizable monomers is contained as an alkali-soluble resin in the image recording layer in addition to the xylenol-containing novolak resin, the monomer components contributing to the alkali-solubility to impart the sufficient alkali-solubility to the image recording material and to fully achieve the effect of improving the latitude for development are preferably contained in an amount of 10 mol % or more, more preferably 20 mol % or more.

The monomer components that can be used for copolymerization with the above-mentioned polymerizable phenolic hydroxyl group-containing monomers, sulfonamide group-containing monomers, and active imide group-containing monomers are classified into the following groups (1) to (12). However, the monomer components are not limited to the following examples.

(1): Acrylic esters and methacrylic esters having an aliphatic hydroxyl group, such as 2-hydroxyethyl acrylate and 2-hydroxyethyl methacrylate.

(2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(4): Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6): Vinyl esters such as vinyl acetate, vinyl chloroacetate, vinyl butyrate, and vinyl benzoate.

(7): Styrenes such as styrene, α-methylstyrene, methylstyrene, and chloromethylstyrene.

(8): Vinyl ketones such as methyl vinyl ketone, ethyl vinyl ketone, propyl vinyl ketone, and phenyl vinyl ketone.

(9): Olefins such as ethylene, propylene, isobutylene, butadiene, and isoprene.

(10): N-vinylpyrrolidone, acrylonitrile, and methacrylonitrile.

(11): Unsaturated imides such as maleimide, N-acryloylacrylamide, N-acetylmethacrylamide, N-propionylmethacrylamide, and N-(p-chlorobenzoyl)methacrylamide.

(12): Unsaturated carboxylic acids such as acrylic acid, methacrylic acid, maleic anhydride, and itaconic acid.

In the case where other alkali-soluble resins than the xylenol-containing novolak resin is a homopolymer of the above-mentioned phenolic hydroxyl group-containing polymerizable monomer, sulfonamide group-containing polymerizable monomer, or active imide group-containing polymerizable monomer, or a copolymer comprising the above-mentioned polymerizable monomer, the weight-average molecular weight (Mw) of the alkali-soluble resin may be preferably 2,000 or more, more preferably in the range of 5,000 to 300,000, and the number-average molecular weight (Mn) of the obtained polymer may be preferably 500 or more, more preferably in the range of 800 to 250,000. The polydispersity (Mw/Mn) is desirably in the range of 1.1 to 10.

Further, an alkali-soluble polymer having a carboxyl group (hereinafter referred to as (B1) component) can be used as an alkali-soluble resin in combination with the xylenol-containing novolak resin. The (B1) component may be any of alkali-soluble polymer having a carboxyl group, and preferred are the polymers (b1-1) and (b1-2) which are defined below.

—(b1-1) Alkali-soluble polymer having a polymerizable monomer unit represented by the following general formula (i) —

wherein Xm represents a single bond or a bivalent connecting group, Y represents hydrogen atom or a carboxyl group, and Z represents hydrogen atom, alkyl or carboxyl group.

A monomer constructing the monomer unit of the formula (i) includes a polymerizable monomer having at least one carboxyl group and at least one polymerizable unsaturated group in the molecule thereof. Specific examples of the polymerizable monomer are α,β-unsaturated carboxylic acids such as acrylic acid, methacrylic acid, maleic acid, maleic anhydride, itaconic acid, itaconic anhydride and the like.

A monomer which is copolymerized with the above polymerizable monomer having a carboxyl group includes those listed below as (1) to (11), but the present invention is not restricted to these specific ones at all:

(1) acrylic acid esters and methacrylic acid esters each carrying an aliphatic hydroxyl group such as 2-hydroxyethyl acrylate and 2-hydroxyethyl methacrylate;

(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methyl styrene, methyl styrene and chloromethyl styrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinyl pyrrolidone, N-vinyl carbazole, 4-vinyl pyridine, acrylonitrile, methacrylonitrile or the like;

(11) unsaturated imides such as maleimide, N-acryloyl acrylamide, N-acetyl methacrylamide, N-propionyl methacrylamide and N-(p-chlorobenzoyl) methacrylamide.

Alternatively, a monomer represented by the following general formula (ii) may also be preferably used.

(ii)
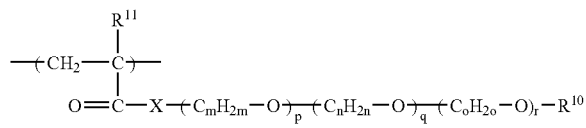

wherein X represents O, S or N—$R^{12}$; $R^{10}$ to $R^{12}$ represent each independently hydrogen atom or an alkyl group; m, n and o represent each independently an integer of from 2 to 5; $C_mH_{2m}$, $C_nH_2n$ and $C_oH_{2o}$ are independently in the form of linear or branched chain; p, q and r represent each independently an integer of from 0 to 3,000, and p+q+r≧2.

The alkyl group represented by $R^{10}$ to $R^{12}$ is preferably an alkyl group having 1 to 12 carbon atoms, and specifically includes methyl, ethyl, n-propyl and isopropyl groups and the like. In the formula, p, q and r represent preferably an integer of from 0 to 500, and more preferably from 0 to 100.

Examples of monomers corresponding to the repeating unit represented by the formula (ii) are listed below, but the present invention is not restricted to these specific ones at all.

(1)

(2)

(3)
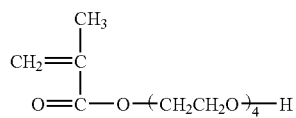
(Average Molecular Weight of Alkyleneoxides: 1000)

(4)

(5)
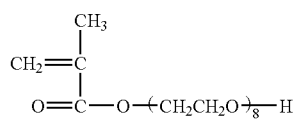
(Average Molecular Weight of Alkyleneoxides: 1000)

(6)
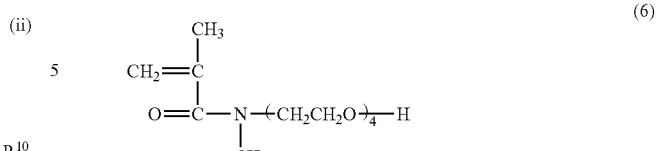

(7)

(8)

(9)

(10)
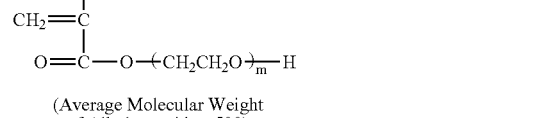
(Average Molecular Weight of Alkyleneoxides: 500)

(11)
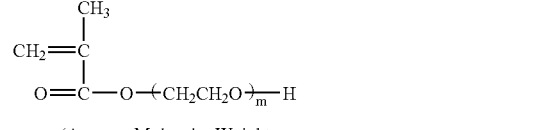
(Average Molecular Weight of Alkyleneoxides: 2000)

(12)

(13)
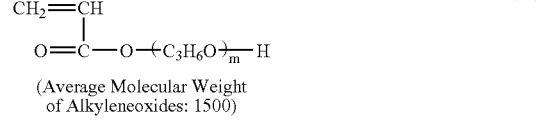
(Average Molecular Weight of Alkyleneoxides: 1500)

(14)
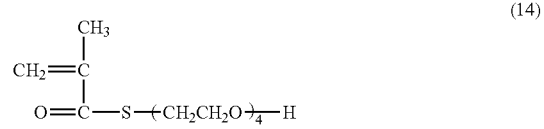

The repeating unit represented by the formula (ii) can be prepared by reacting a commercially available hydroxy poly (oxyalkylene) material such as Pluronic (trade name) manufactured by Asahi Denka Co., Ltd., AdekaPolyether (trade name) manufactured by Asahi Denka Co., Ltd., Carbowax (trade name) manufactured by Glyco Products, Toriton (trade name) manufactured by Rohm and Haas and P.E.G manufactured by Dai-Ichi Kogyo Seiyaku Co., Ltd., with acrylic acid, methacrylic acid, acrylchloride, methacrylchloride, acrylic anhydride or the like in a well known method.

Alternatively, poly(oxyalkylene) diacrylate can be used, which is prepared by a well known method.

Commercially available monomers include a hydroxyl-terminated polyalkylene glycol mono(meth)acrylate manufactured by Nippon Yushi Co., Ltd. such as Blenmer PE-90, Blenmer PE-200, Blenmer PE-350, Blenmer AE-90, Blenmer AE-200, Blenmer AE-400, Blenmer PP-1000, Blenmer PP-500, Blenmer PP-800, Blenmer AP-150, Blenmer AP-400, Blenmer AP-550, Blenmer AP-800, Blenmer 50PEP-300, Blenmer 70PEP-350B, Blenmer AEP Series, Blenmer 55PET-400, Blenmer 30PET-800, Blenmer 55PET-800, Blenmer AET Series, Blenmer 30PPT-800, Blenmer 50PPT-800, Blenmer 70PPT-800, Blenmer APT Series, Blenmer 10PPB-500B, Blenmer 10APB-500B and the like. Similarly, there are an alkyl-terminated polyalkylene glycol mono (meth)acrylate manufactured by Nippon Yushi Co., Ltd. such as Blenmer PME-100, Blenmer PME-200, Blenmer PME-400, Blenmer PME-1000, Blenmer PME-4000, Blenmer AME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP Series, Blenmer PKEP Series, Blenmer AKEP Series, Blenmer ANE-300, Blenmer ANE-1300, Blenmer PNEP Series, Blenmer PNPE Series, Blenmer 43 ANEP-500, Blenmer 70ANEP-550, and products manufactured by Kyoei Chemicals Co., Ltd. such as Light Ester MC, Light Ester 130MA, Light Esters 041 MA, Light Acrylate BO-A, Light Acrylate EC-A, Light Acrylate MTG-A, Light Acrylate 130A, Light Acrylate DPM-A, Light Acrylate P-200A, Light Acrylate NP-4EA, Light Acrylate NP-8EA and the like.

The minimum constitutional unit in the polymer (b1-1), which has the polymerizable monomer component having intramolecularly at least one carboxyl group and at least one polymerizable unsaturated group may be alone, or two or more in combination. It is possible to use the compound obtained by copolymerizing two or more minimum constitutional units having the same acidic group, or two or more minimum constitutional units having different acidic groups. A method which is usable for copolymerization may be a conventional method such as a graft copolymerization, a block copolymerization, a random copolymerization and the like.

—(b1-2) Alkali-soluble polymer having a carboxyl group, which has as a basic skeleton, a reaction product of a diol compound having a carboxyl group represented by the following general formula (iii), (iv) or (v) and a diisocyanate compound represented by the following formula (viii)—

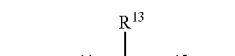
(iii)

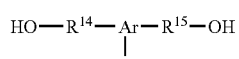
(iv)

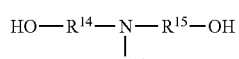
(v)

wherein $R^{13}$ represents hydrogen atom, or an alkyl, alkenyl, aralkyl, aryl, alkoxy or aryloxy group which may have a substituent such as alkyl, aryl, alkoxy, ester, urethane, amide, ureido and halogeno group, and preferably hydrogen atom, an alkyl group having 1 to 8 carbon atoms, an alkenyl group having 2 to 8 carbon atoms, and an aryl group having 6 to 15 carbon atoms; $R^{14}$, $R^{15}$ and $R^{16}$, which may be the same or different, each represent a single bond, a bivalent aliphatic or aromatic hydrocarbon group which may have a substituent such as alkyl, alkenyl, aralkyl, aryl, alkoxy and halogeno group, preferably an alkylene group having 1 to 20 carbon atoms and an arylene group having 6 to 15 carbon atoms, and more preferably an alkylene group having 1 to 8 carbon atoms.

Where necessary, $R^{14}$, $R^{15}$ and $R^{16}$ may have additionally a functional group which is not reactive to an isocyanate group, such as ester group, urethane group, amide group, ureido group and unsaturated bond between carbons. Two or three of $R^{13}$, $R^{14}$, $R^{15}$ and $R^{16}$ may form a ring together.

Ar represents a trivalent aromatic hydrocarbon group which may have a substituent, and preferably an aromatic group having 6 to 15 carbon atoms.

(viii)

wherein $R^{18}$ represents a bivalent aliphatic or aromatic hydrocarbon group which may have a substituent such as alkyl, alkenyl, aralkyl, aryl, alkoxy and halogeno group. Where necessary, $R^{18}$ may have additionally a functional group which is not reactive to an isocyanate group, such as ester group, urethane group, amide group, ureido group and unsaturated bond between carbons.

The diol compound having a carboxyl group represented by the formula (iii), (iv) or (v) includes 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 4,4-bis(4-hydroxyphenyl) pentanoic acid, tartaric acid, N,N-bis(2-hydroxyethyl)-3-carboxy-propionamide, and the like.

The alkali-soluble polymer having a carboxyl group (b1-2) is preferably a reaction product wherein a diol compound represented by the following general formula (vi) or (vii) is combined.

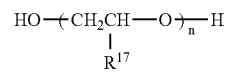
(vi)

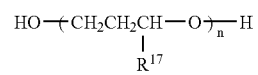
(vii)

wherein $R^{17}$ each represents hydrogen atom or an alkyl group having 1 to 8 carbon atoms, n represents an integer of 2 or more. The alkyl group having 1 to 8 carbon atoms represented by $R^{17}$ includes methyl, ethyl, isopropyl, n-butyl and isobutyl groups.

Specific examples of the diol represented by the formula (vi) or (vii) are shown below, but the present invention is not restricted to these specific ones at all. Examples of the compound represented by the formula (vi):

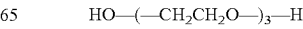

HO—(—CH₂CH₂O—)₅—H

HO—(—CH₂CH₂O—)₆—H

HO—(—CH₂CH₂O—)₇—H

HO—(—CH₂CH₂O—)₈—H

HO—(—CH₂CH₂O—)₁₀—H

HO—(—CH₂CH₂O—)₁₂—H

Polyethylene glycol (average molecular weight: 1000)

Polyethylene glycol (average molecular weight: 2000)

Polyethylene glycol (average molecular weight: 4000)

HO—(—CH₂CH(CH₃)O—)₃—H

HO—(—CH₂CH(CH₃)O—)₄—H

HO—(—CH₂CH(CH₃)O—)₆—H

Polypropylene glycol (average molecular weight: 1000)

Polypropylene glycol (average molecular weight: 2000)

Polypropylene glycol (average molecular weight: 4000)

Examples of the compound represented by the formula (vii):

HO—(—CH₂CH₂CH₂O—)₃—H

HO—(—CH₂CH₂CH₂O—)₄—H

HO—(—CH₂CH₂CH₂O—)₈—H

HO—(—CH₂CH₂CH(CH 3)O—)₁₂—H

Specific examples of the diisocyanate compound represented by the formula (viii) are aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethan diisocyanate, 1,5-naphthalene diisocyanate and 3,3'-dimethylbiphenyl-4,4'-diisocyanate, aliphatic diisocyanate compounds such as hexamethylene diisocyanate, trimethylhexamethylene diisocyanate, lysine diisocyanate and dimer acid diisocyanate, aliphatic diisocyanate compounds such as isophorone diisocyanate, 4,4'-methylene bis(cyclohexylisocyanate), methylcyclohexane-2,4(2,6)-diisocyanate and 1,3-(isocyanate methyl)cyclohexane, and a reaction product of a diol and a diisocyanate such as an adduct of 1 mole of 1,3-butylene glycol and 2 moles of tolylenediisocyanate.

In the synthesis of the polymer (b1-2), a molar ratio of the diisocyanate compound and the diol compound which are used is preferably from 0.8:1 to 1.2:1. When an isocyanate group remains at the terminal of polymers obtained, the polymer can be treated with alcohols or amines to finally synthesize ones free of an isocyanate group.

As the component (B1), any one or any combination of at least two selected from the polymers (b1-1) and (b1-2) can be used.

The amount of the repeating unit having a carboxyl group in the component (B1) is generally 2 mol % or more on the basis of the total monomeric amount in the component (B1), preferably from 2 to 70 mol %, and more preferably from 5 to 60 mol %.

The component (B1) has preferably a weight-average molecular weight of from 3,000 to 300,000, and more preferably from 6,000 to 100,000.

Other alkali-soluble resins than the xylenol-containing novolak resin, which are mentioned above, can be used alone or in combination, and the alkali-soluble resin can be used preferably in the amount ratio by weight to the xylenol-containing novolak resin of from 0.05/1 to 1/0.1, and more preferably from 0.1/1 to 1/0.2.

[IR-Absorbing Dye]

IR-absorbing dyes used in the image recording layer according to the present invention is not limited to specific ones, provided that is a dye which is capable of absorbing infrared ray and generating heat, and include various dyes which are known in the art as an IR-absorbing dye.

The IR-absorbing dye materials may be commercially available ones or those known in the literature (see, for instance, "SENRYO BINRAN", edited by YUKI GOSEI KAGAKU KYOKAI, Published in Showa 45 (1970)) and specific examples thereof are azo dyes, metal complex azo dyes, pyrazolone azo dyes, quinoneimine dyes, methine dyes, cyanine dyes, and the like. Among them, the ones capable of absorbing infrared ray or near infrared ray are suitable, since they can be used suitably with a laser emitting infrared ray or near infrared ray.

Examples of such dyes which absorbing infrared ray or near infrared ray include cyanine dyes such as those disclosed in, for example, Japanese Un-Examined Patent Publication Nos. Sho 58-125246, Sho 59-84356, Sho 59-202829 and Sho 60-78787; methine dyes such as those disclosed in, for instance, Japanese Un-Examined Patent Publication Nos. Sho 58-173696, Sho 58-181690 and Sho 58-194595; naphthoquinone dyes such as those disclosed in, for instance, Japanese Un-Examined Patent Publication Nos. Sho 58-112793, Sho 58-224793, Sho 59-48187, Sho 59-73996, Sho 60-52940 and Sho 60-63744; squarylium dyes such as those described in, for instance, Japanese Un-Examined Patent Publication No. Sho 58-112792; and cyanine dyes such as those disclosed in, for instance, G.B. Patent No. 434,875.

Preferably used as the dye herein also include, for instance, sensitizing agents capable of absorbing near infrared rays disclosed in U.S. Pat. No. 5,156,938; substituted arylbenzo (thio) pyrylium salts disclosed in U.S. Pat. No. 3,881,924; trimethine thiopyrylium salts disclosed in Japanese Un-Examined Patent Publication No. Sho 57-142645 (U.S. Pat. No. 4,327,169); pyrylium compounds disclosed in Japanese Un-Examined Patent Publication Nos. Sho 58-181051, Sho-58-220143, Sho 59-41363, Sho 59-84248, Sho 59-84249, Sho 59-146063 and 59-146061; cyanine dyes disclosed in Japanese Un-Examined Patent Publication No. Sho 59-216146; pentamethine thiopyrylium salts disclosed in U.S. Pat. No. 4,283,475; pyrylium compounds disclosed in Japanese Examined Patent Publication Nos. Hei 5-13514 and Hei 5-19702; and commercially available ones such as Epolight III-178, Epolight III-130, Epolight III-125 and like (available from Epoline Company).

Preferably used in the heat-sensitive layer also include dyes such as those represented by the general formulas (I) and (II) disclosed in U.S. Pat. No. 4,756,993. Said dye exhibits remarkably strong interaction with an alkali-soluble resin, and therefore it is excellent in resistance to alkali-development of the unexposed area in the heat-sensitive layer.

The content of the dye in the heat-sensitive layer ranges from 0.01 to 50% by weight from the aspect of sensitivity and durability of the heat-sensitive layer, preferably from 0.1 to 50% by weight and more preferably from 0.1 to 30% by weight with respect to the total weight of the solid content of the heat-sensitive layer.

Specific examples of the IR-absorbing dye are shown below, but the present invention is not restricted to these specific compounds.

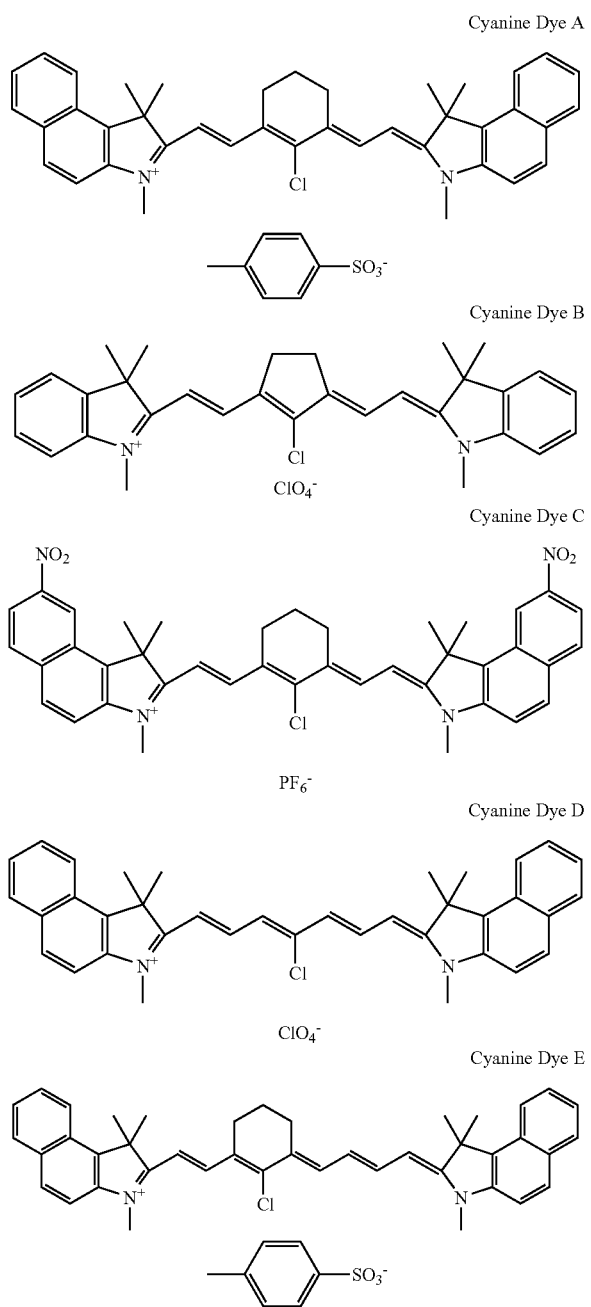

[Other Additives]

For the formation of the image recording layer, a variety of additives may be used if necessary, in addition to the above-mentioned components so as not to impair the effects of the present invention.

—Compound capable of inhibiting the solubility of image recording material in developing solution—

In the heat-sensitive PS plate for lithographic printing for use in the present invention, the image recording layer may further comprise a variety of inhibitors that can inhibit the alkali-soluble polymer from easily dissolving in the developing solution. The above-mentioned inhibitors are not particularly limited, and quaternary ammonium salts and polyethylene glycol compounds can be used.

The quaternary ammonium salts are not particularly limited, but include tetraalkyl ammonium salt, trialkyllauryl ammonium salt, dialkyldiaryl ammonium salt, alkyltriaryl ammonium salt, tetraaryl ammonium salt, cyclic ammonium salt, and bicyclic ammonium salt.

Specific examples of the quaternary ammonium salts are tetrabutyl ammonium bromide, tetrapentyl ammonium bromide, tetrahexyl ammonium bromide, tetraoctyl ammonium bromide, tetralauryl ammonium bromide, tetraphenyl ammonium bromide, tetranaphthyl ammonium bromide, tetrabutyl ammonium chloride, tetrabutyl ammonium iodide, tetrastearyl ammonium bromide, lauryl trimethyl ammonium bromide, stearyl trimethyl ammonium bromide, behenyl trimethyl ammonium bromide, lauryl triethyl ammonium bromide, phenyl trimethyl ammonium bromide, 3-trifluoromethylphenyl trimethyl ammonium bromide, benzyl trimethyl ammonium bromide, dibenzyl dimethyl ammonium bromide, distearyl dimethyl ammonium bromide, tristearylmethyl ammonium bromide, benzyltriethyl ammonium bromide, hydroxyphenyl trimethyl ammonium bromide, and N-methylpyridinium bromide. In particular, quaternary ammonium salts described in JP KOKAI Nos. 2003-107688 and 2003-167332 are preferably used.

It is preferable that the quaternary ammonium salt serving as the above-mentioned inhibitor be contained in the image recording layer in an amount of 0.1 to 50% by weight from the aspect of sufficient inhibiting effect and no adverse effect on film-forming properties of binders, more preferably 1 to 30% by weight, in terms of the solid content with respect to the total weight of the solid content of the image recording layer.

The polyethylene glycol compound used as the aforementioned inhibitor is not particularly limited. The polyethylene glycol with the following structure is preferably employed in the present invention.

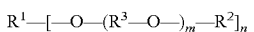

wherein $R^1$ is a residue of a polyhydric alcohol or polyhydric phenol; $R^2$ is a hydrogen atom, or an alkyl group, an alkenyl group, an alkynyl group, alkyloyl group, an aryl group, or an aryloyl group, which has 1 to 25 carbon atoms and may have a substituent; $R^3$ is a residue of an alkylene group which may have a substituent; m is 10 or more on average; and n is an integer of 1 to 4.

Examples of the polyethylene glycol compounds having the above-mentioned structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycol ethylenediamines, polypropylene glycol ethylenediamines, polyethylene glycol diethylenetriamines, and polypropylene glycol diethylenetriamines.

Specific examples of the above-mentioned polyethylene glycol compounds are polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonylic ester, polyethylene glycol cetylic ester, polyethylene glycol stearoyl ester, polyethylene glycol distearoyl ester, polyethylene glycol behenic ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauryl ester, polypropylene glycol dilauryl ester, polypropylene glycol nonylic ester, polyethylene glycol glycerin ether, polypropylene glycol glycerin ether, polyethylene glycol sorbitol ether, polypropylene glycol sorbitol ether, polyethylene glycol ethylenediamine, polypropylene glycol ethylenediamine, polyethylene glycol diethylenetriamine, polypropylene glycol diethylenetriamine, and polyethylene glycol pentamethylenehexamine.

The amount of the polyethylene glycol compound may be in the range of 0.1 to 50% by weight from the aspect of sufficient inhibiting effect and no adverse effect on image-forming properties of binders, preferably 1 to 30% by weight, in terms of the solid content with respect to the total weight of the solid content for use in the image recording layer.

The decrease in sensitivity, which is caused when the solubility of the alkali-soluble polymer in the developing solution is inhibited as mentioned above, can effectively be avoided by the addition of a lactone compound. When the developing solution permeates through the light-exposed portion of the image recording layer, the lactone compound reacts with the developing solution to form a carboxylic acid compound, which will contribute to dissolving of the light-exposed portion of the image recording layer. Thus, the decrease in sensitivity can be prevented.

The lactone compound for use in the present invention is not particularly limited. For example, lactone compounds represented by the following formulas (L-I) and (L-II) can be used.

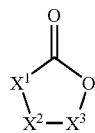
(L-I)

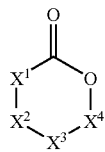
(L-II)

In the above formulas (L-I) and (L-II), $X^1$, $X^2$, $X^3$ and $X^4$ are each an atom or a group for forming a ring, which may be the same or different and independently have a substituent. At least one of $X^1$, $X^2$ or $X^3$ in the formula (L-I), and at least one of $X^1$, $X^2$, $X^3$ or $X^4$ in the formula (L-II) have an electron attractive substituent or a substituent having an electron attractive substituent.

The atoms or groups represented by $X^1$, $X^2$, $X^3$ and $X^4$ which constitute the ring are each a non-metallic atom having two single bonds or a group including the above-mentioned non-metallic atom for forming the ring.

Preferable non-metallic atoms and preferable groups including the non-metallic atoms are methylene group, sulfinyl group, carbonyl group, thiocarbonyl group, sulfonyl group, sulfur atom, oxygen atom, and selenium atom. In particular, methylene group, carbonyl group and sulfonyl group are preferably used.

As mentioned above, at least one of $X^1$, $X^2$ or $X^3$ in the formula (L-I), and at least one of $X^1$, $X^2$, $X^3$ or $X^4$ in the formula (L-II) have an electron attractive group. The electron attractive group herein used is a group where the Hammett's substituent constant represented by σp is positive. For the Hammett's substituent constant, Journal of Medicinal Chemistry, 1973, vol. 16, No. 11, 1207-1216 can serve as a reference. Examples of the electron attractive group where the Hammett's substituent constant represented by σp is a positive value include a halogen atom such as fluorine atom (σp value of 0.06), chlorine atom (σp value of 0.23), bromine atom (σp value of 0.23) and iodine atom (σp value of 0.18); trihaloalkyl group such as tribromomethyl group (σp value of 0.29), trichloromethyl group (σp value of 0.33) and trifluoromethyl group (σp value of 0.54); cyano group (σp value of 0.66); nitro group (σp value of 0.78); aliphatic, aryl or heterocyclic sulfonyl group such as methanesulfonyl group (σp value of 0.72); aliphatic, aryl or heterocyclic acyl group such as acetyl group (σp value of 0.50) and benzoyl group (σp value of 0.43); alkynyl group such as C≡CH group (σp value of 0.23); aliphatic, aryl or heterocyclic oxycarbonyl group such as methoxycarbonyl group (σp value of 0.45) and phenoxycarbonyl group (σp value of 0.44); carbamoyl group (σp value of 0.36); sulfamoyl group (σp value of 0.57); sulfoxide group; heterocyclic group; oxo group; and phosphoryl group.

Preferable examples of the electron attractive groups are amide group, azo group, nitro group, fluoroalkyl group having 1 to 5 carbon atoms, nitrile group, alkoxycarbonyl group having 1 to 5 carbon atoms, acyl group having 1 to 5 carbon atoms, alkylsulfonyl group having 1 to 9 carbon atoms, arylsulfonyl group having 6 to 9 carbon atoms, alkylsulfinyl group having 1 to 9 carbon atoms, arylsulfinyl group having 6 to 9 carbon atoms, arylcarbonyl group having 6 to 9 carbon atoms, thiocarbonyl group, fluorine-containing alkyl group having 1 to 9 carbon atoms, fluorine-containing aryl group having 6 to 9 carbon atoms, fluorine-containing allyl group having 3 to 9 carbon atoms, oxo group, and halogen atoms.

Among the above groups, more preferably used are nitro group, fluoroalkyl group having 1 to 5 carbon atoms, nitrile group, alkoxycarbonyl group having 1 to 5 carbon atoms, acyl group having 1 to 5 carbon atoms, arylsulfonyl group having 6 to 9 carbon atoms, arylcarbonyl group having 6 to 9 carbon atoms, oxo group, and halogen atoms.

Specific examples of the compounds represented by formulas (L-I) and (L-II) are shown as follows. However, the lactone compounds for use in the present invention are not limited to the following examples.

(LI-1) 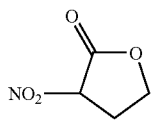
(LI-2) 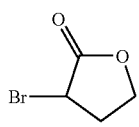
(LI-3) 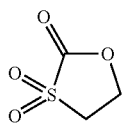
(LI-4) 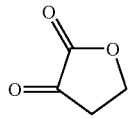
(LI-5) 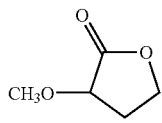
(LI-6) 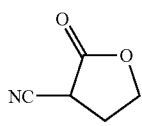
(LI-7) 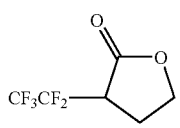
(LI-8) 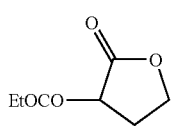
(LI-9) 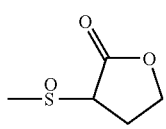
(LI-10) 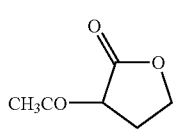
(LI-11) 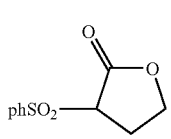
(LI-12) 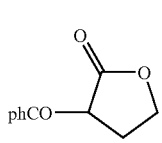
-continued
(LI-13) 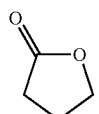
(LI-14) 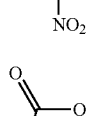
(LI-15) 
(LI-16) 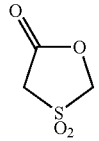
(LI-17) 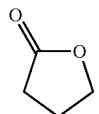
(LI-18) 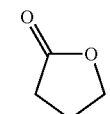
(LI-19) 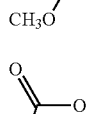
(LI-20) 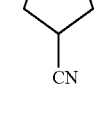
(LI-21) 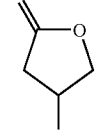

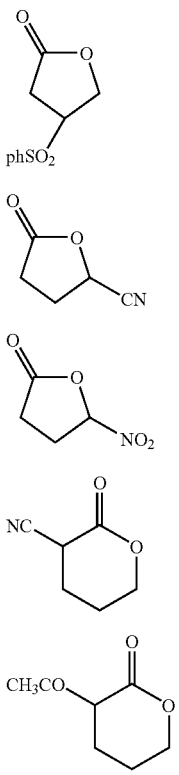

(LI-22)
(LI-23)
(LI-24)
(LII-1)
(LII-2)

The lactone compound represented by formulas (L-I) and (L-II) may be contained in the image recording layer in an amount of 0.1 to 50% by weight from the aspect of satisfactory effect and favorable image-forming performance, preferably 1 to 30% by weight, in terms of the solid content with respect to the total weight of the solid content of the image recording layer. It is desirable that the lactone compound be selectively brought into contact with the developing solution to cause the reaction therewith.

The above-mentioned lactone compounds may be used alone or in combination. Further, two or more kinds of lactone compounds having formula (L-I) and two or more kinds of lactone compounds having formula (L-II) may be used together at an arbitrary mixing ratio so that the total weight of the lactone compounds is within the above-mentioned range.

—Material which can be pyrolytically decomposed and can substantially decrease the solubility of the alkali-soluble polymer in the alkaline developing solution before pyrolytical decomposition—

Moreover, to further effectively inhibit the non-light exposed portion of the image recording layer from unfavorably dissolving in the developing solution, it is also preferable to use materials which can be pyrolytically decomposed and can substantially decrease the solubility of the alkali-soluble polymer in the alkaline developing solution before pyrolytical decomposition. Such materials include onium salts, o-quinonediazide compounds, aromatic sulfone compounds, and aromatic sulfonic acid ester compounds and the like. The onium salts include diazonium salt, ammonium salt, phosphonium salt, iodonium salt, sulfonium salt, selenonium salt, arsonium salt and the like.

More specifically, preferable examples of the onium salts are diazonium salts described in S. I. Schlesinger, Photogr. Sci. Eng., 18, 387 (1974), T. S. Bal et al., Polymer, 21, 423 (1980), and JP KOKAI No. Hei 5-158230; ammonium salts described in U.S. Pat. Nos. 4,069,055 and 4,069,056, and JP KOKAI No. Hei 3-140140; phosphonium salts described in D. C. Necker et al., Macromolecules, 17, 2468 (1984), C. S. Wen et al., Teh, Proc. Conf. Rad. Curing ASIA, p 478 Tokyo, October (1988), and U.S. Pat. Nos. 4,069,055 and 4,069,056; iodonium salts described in J. V. Crivello et al., Macromolecules, 10(6), 1307 (1977), Chem. & Eng. News, Nov. 28, p 31 (1988), EP 104,143, U.S. Pat. Nos. 339,049 and 410,201, and JP KOKAI Nos. Hei 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. Nos. 4,933,377, 3,902,114, 410,201, 339,049, 4,760,013, 4,734,444 and 2,833,827, and DP Nos. 2,904,626, 3,604,580 and 3,604,581; selenonium salts described in J. V. Crivello et al., Macromolecules, 10(6), 1307 (1977), and J. V. Crivello et al., J. Polymer Sci., Polymer Chem. Ed., 17, 1047 (1979); and arsonium salts described in C. S. Wen et al., Teh, Proc. Conf. Rad. Curing ASIA, p 478 Tokyo, October (1988).

Of those onium salts, preferably used are diazonium salts, in particular, diazonium salts disclosed in JP KOKAI No. Hei 5-158230.

As the counter ions for the onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like can be employed. In particular, hexafluorophosphoric acid and alkyl aromatic sulfonic acid such as triisopropylnaphthalenesulfonic acid and 2,5-dimethylbenzenesulfonic acid are preferably used.

Suitable quinonediazide compounds for use in the present invention include o-quinonediazide compounds. The o-quinonediazide compound for use in the present invention is a compound having at least one o-quinonediazide group, which compound can exhibit increased alkali-solubility by pyrolysis. There can be employed o-quinonediazide compounds with various structures. The o-quinonediazide compounds herein used can contribute to the solubility characteristics of the image recording layer because the o-quinonediazide compounds have the characteristics that they lose the force to inhibit the binder agent from dissolving in the developing solution and the o-quinonediazide compounds themselves turns into alkali-soluble materials when thermally decomposed. For example, the o-quinonediazide compounds described in J. Kosar "Light-sensitive Systems" (John Wiley & Sons. Inc.) pp. 339-352 can be used in the present invention. In particular, sulfonic esters of o-quinonediazide compounds or sulfonamides obtained by the reaction with a variety of aromatic polyhydroxyl compounds or aromatic amino compounds are preferable. In addition, esters of benzoquinone-(1,2)-diazidesulfonic acid chloride or naphthoquinone-(1,2)-diazide-5-sulfonic acid chloride with pyrogallol-acetone resin as described in JP KOKOKU No. Sho 43-28403; and esters of benzoquinone-(1,2)-diazidesulfonic acid chloride or naphthoquinone-(1,2)-diazide-5-sulfonic acid chloride with phenol-formaldehyde resin as described in U.S. Pat. Nos. 3,046,120 and 3,188,210 are also preferably used in the present invention.

Similarly, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin can also be preferably employed. Other suitable o-quinonediazide compounds are described in many patent specifications, for example, JP KOKAI Nos. Sho 47-5303, 48-63802, 48-63803, 48-96575, 49-38701 and 48-13354, JP KOKOKU Nos. Sho 41-11222, 45-9610 and 49-17481, U.S. Pat. Nos. 2,797,213, 3,454,400, 3,544,323, 3,573,917, 3,674,495 and 3,785,825, BP Nos. 1,227,602, 1,251,345, 1,267,005, 1,329,888 and 1,330,932, and DP No. 854,890.

It is preferable that the o-quinonediazide compound be contained in an amount of 1 to 50% by weight, more preferably 5 to 30% by weight, and most preferably 10 to 30% by weight, with respect to the total solid content of the image recording layer. The above-mentioned o-quinonediazide compounds may be used alone or in combination.

The image recording layer may further comprise the alkali-soluble resin wherein at least a part thereof is esterified, said resin being described in JP KOKAI No. Hei 11-288089.

To more effectively inhibit the alkali-soluble polymer from dissolving in the developing solution, and at the same time, to impart the increased scratch resistance to the surface portion of the image recording layer, it is preferable that the image recording layer further comprise polymers including a (meth) acrylate monomer having two or three perfluoroalkyl groups with 3 to 20 carbon atoms in the molecule thereof, as described in JP KOKAI No. 2000-187318. Such a polymer may be contained in an amount of 0.1 to 10% by weight, more preferably 0.5 to 5% by weight of the total weight of materials for the image recording layer.

—Development Promoting Agent—

The heat-sensitive layer of the PS plate may further comprise acid anhydrides, phenolics and organic acids to improve the sensitivity.

With respect to the acid anhydrides, cyclic acid anhydrides are preferable. More specifically, the cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenyl maleic anhydride, succinic anhydride, and pyromellitic anhydride disclosed in U.S. Pat. No. 4,115,128. Non-cyclic acid anhydrides include acetic anhydride.

Examples of the phenolics for use in the present invention are bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

The organic acids include sulfonic acids, sulfinic acids, alkylsulfuric acids, phosphonic acids, phosphoric esters, and carboxylic acids as described in JP KOKAI Nos. Sho 60-88942 and Hei 2-96755. Specific examples of the organic acids are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

It is preferable that the above-mentioned acid anhydrides, phenolics and organic acids be contained in an amount of 0.05 to 20% by weight, more preferably 0.1 to 15% by weight, and most preferably 0.1 to 10% by weight, with respect to the total weight of solid content of the image recording layer.

—Surfactant—

The image recording layer may further comprise nonionic surfactants as described in JP KOKAI Nos. Sho 62-251740 and Hei 3-208514, ampholytic surfactants as described in JP KOKAI Nos. Sho 59-121044 and Hei 4-13149, siloxane compounds as described in EP 950,517, and copolymers comprising a fluorine-containing monomer as described in JP KOKAI Nos. Sho 62-170950, Hei 11-288093 and 2003-57820 to upgrade the coating properties and ensure the stable operation depending upon the development conditions.

Specific examples of the nonionic surfactants are sorbitan tristearate, sorbitan monopalmitate, sorbitan trioleate, stearic acid monoglyceride, and polyoxyethylene nonylphenyl ether. Specific examples of the ampholytic surfactants are alkyldi (aminoethyl)glycine, alkylpolyaminoethylglycine hydrochloride, 2-alkyl-N-carboxyethyl-N-hydroxyethyl imidazolinium betaine, and N-tetradecyl-N,N-betaine (e.g., "Amogen K" (trade name) made by Dai-Ichi Kogyo Seiyaku Co., Ltd.).

Block copolymers of dimethyl siloxane and polyalkylene oxide are preferably employed as the siloxane compounds. More specifically, commercially available polyalkylene oxide modified silicone products such as "DBE-224", "DBE-621", "DBE-712", "DBP-732" and "DBP-534", made by Chisso Corporation; and "Tego Glide 100" (trade name), made by Tego Chemie Service GmbH can preferably be employed in the present invention.

It is preferable that the amount of the above-mentioned nonionic surfactants and ampholytic surfactants be in the range of 0.01 to 15% by weight, more preferably 0.1 to 5% by weight, and most preferably 0.05 to 0.5% by weight, with respect to the total weight of solid content of the image recording layer.

—Printing-Out Agent/Coloring Agent—

The image recording layer of the PS plate for use in the present invention may comprise a printing-out agent and a coloring agent for images such as a dye and a pigment to obtain visible images immediately after the image recording layer is heated by light exposure.

One of the representative examples of the printing-out agent is a combination of a compound capable of generating an acid when heated by light exposure and an organic dye capable of forming a salt together with the above-mentioned acid-generating compound. Examples of such a printing-out agent include the combination of o-naphthoquinonediazide-4-sulfonic acid halogenide with a salt-forming organic dye disclosed in JP KOKAI Nos. Sho 50-36209 and 53-8128, and the combination of a trihalomethyl compound with a salt-forming organic dye disclosed in JP KOKAI Nos. Sho 53-36223, 54-74728, 60-3626, 61-143748, 61-151644 and 63-58440. The above-mentioned trihalomethyl compound includes oxazole compounds and triazine compounds, both of which can exhibit excellent stability with time and produce clear printed-out images.

The coloring agent for forming image portions includes not only the above-mentioned salt-forming organic dyes, but also other dyes. Preferable dyes including the salt-forming organic dyes are classified into oil-soluble dyes and basic dyes. Specific examples of such dyes are Oil Yellow #101, Oil Yellow #103, Oil Pink #312, Oil Green BG, Oil Blue BOS, Oil Blue #603, Oil Black BY, Oil Black BS, and Oil Black T-505, which are made by Orient Chemical Industries, Ltd.; and Victoria Pure Blue, Crystal Violet Lactone, Crystal Violet (CI 42555), Methyl Violet (CI 42535), Ethyl Violet, Rhodamine B (CI 145170B), Malachite Green (CI 42000), and Methylene Blue (CI 52015). Dyes disclosed in JP KOKAI No. Sho 62-293247 are particularly preferable. Those dyes may be contained in an amount of 0.01 to 10% by weight, preferably 0.1 to 3% by weight, with respect to the total solid content of the image recording layer.

—Plasticizer—

The image recording layer of the PS plate for use in the present invention may further comprise a plasticizer, if necessary, to impart the flexibility and other properties to the image recording layer. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

—Wax—

The image recording layer of the PS plate for use in the present invention may further comprise a compound for decreasing the coefficient of static friction of the surface so as to improve the scratch resistance. More specifically, compounds having a long-chain alkylcarboxylic ester as described in U.S. Pat. No. 6,117,913 and JP KOKAI Nos. 2003-149799, 2003-302750 and 2004-12770 can be used as the wax.

Such a wax may be contained in an amount of 0.1 to 10% by weight, preferably 0.5 to 5% by weight, with respect to the total weight of solid content of the heat-sensitive layer.

The above-mentioned components are dissolved in a solvent to prepare a coating liquid for heat-sensitive layer, and then the coating liquid is applied to a suitable substrate so as to make a PS plate.

[Solvent Used for Coating Liquid for Heat-Sensitive Layer]

Examples of the solvent used to prepare the coating liquids for the heat-sensitive layer include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. The solvents for use in the present invention are not limited to the above-mentioned examples. Those solvents may be used alone or in combination.

When the image recording layer consists of an upper recording layer and a lower recording layer and these layers are provided adjacently, in selecting the solvents for preparation of the coating liquids, it is desirably considered that a solvent for coating the upper recording layer be selected substantially not to dissolve the lower recording layer in order to avoid the miscibility at the interface between the two layers. The concentration of the entire solid content of the components including the additives in the solvent may be preferably in the range of 1 to 50% by weight.

When an acid anhydride is used, the coating liquid has preferably water content of not more than 0.5% by weight.

[Amount of Coating]

The coating liquid for formation of the image recording layer may preferably be applied to the substrate for use in the PS plate with a deposition amount (solid amount) ranging from 0.3 to 3.0 g/m² from the aspect of the film properties and the printing durability. The amount is preferably from 0.5 to 2.5 g/m², and more preferably from 0.8 to 1.6 g/m².

[Layered Structure]

The PS plate used for the present invention is the one wherein the image recording layer comprising the above-mentioned components is provided on a substrate, and the image recording layer may have a layered structure consisting of at least two layers. Hereinafter, a case wherein the image recording layer consists of two layers of upper layer and lower layer is explained.

In this case, the alkali-soluble resin contained in the upper layer and the lower layer may be the one which is described above, and the alkali-soluble resin used in the upper layer is preferably less soluble in alkali than one used in the lower layer.

The IR-absorbing dye used in the each layer may be the same or different, and two or more IR-absorbing dyes may be used in the respective layer. The amount of the IR-absorbing dye in any one of the both layers is, as described above, from 0.01 to 50% by weight with respect to the total solid content of the layer to which the dye is added, preferably from 0.1 to 50% by weight, and more preferably from 0.1 to 30% by weight. In case that the IR-absorbing dye is added to the both layers, it is desirable that the total amount of the IR-absorbing dye is in the above range.

As to the materials which can be pyrolytically decomposed and can substantially decrease the solubility of the alkali-soluble polymer in the alkaline developing solution before pyrolytical decomposition, it is effective to involve this material in the lower layer, when the image recording layer has a layered structure, since this material may decompose partially with time. However, any of the upper layer and the lower layer may comprise this material, or the both layers may comprise this material. The amount of this material is as described above. When this material is incorporated into plural layers, the total of the amount thereof is preferably within the above range.

It is effective to use the lactone compound in the upper layer when the image recording layer has a layered structure. However, any one of the upper layer and the lower layer, or the both layers may comprise the lactone compound.

[Substrate]

In the PS plate for lithographic printing for use in the present invention, any dimensionally stable plate-shaped materials with a required strength and durability can be used as the hydrophilic substrate. Preferably used are a sheet of paper; a laminated sheet prepared by covering paper with a thin layer of plastic, such as polyethylene, polypropylene or polystyrene; a metal plate made of, for example, aluminum, zinc or copper; a plastic film made of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal; and a sheet of paper or plastic film to which the above-mentioned metals are attached or deposited.

A polyester film and an aluminum plate are particularly preferable as the substrate for the PS plate in the present invention. In particular, the aluminum plate is most preferable because the dimensional stability is excellent and the cost is relatively low.

Aluminum plates substantially composed of pure aluminum or an aluminum alloy containing a trace amount of elements other than aluminum are suitable. In addition, plastic sheets to which the aluminum plate is attached or the aluminum is deposited are also preferable. Examples of the above-mentioned elements used in the aluminum alloys are silicon, iron, manganese, copper, magnesium, chromium, zinc, bismuth, nickel and titanium. The content of such elements for use in the aluminum alloy is at most 10% by weight.

Although the pure aluminum plates are particularly preferable for the substrate, production of perfectly pure aluminum is difficult from the viewpoint of the refining technique, so that a trace amount of different elements may be contained. In such a way, the composition of the aluminum plate is not particularly limited, and conventional aluminum plates may be appropriately used for the substrate of the PS plate in the present invention. The thickness of the aluminum plate serving as the substrate is within the range from about 0.1 to about 0.6 mm, preferably 0.15 to 0.4 mm, and more preferably 0.2 to 0.3 mm.

The aluminum plate may be first subjected to degreasing, if required, prior to the surface roughening treatment, using a surfactant, an organic solvent, or an aqueous alkaline solution to remove rolling oil from the surface of the aluminum plate.

To provide the aluminum plate with a grained surface, there can be used various methods, for example, a method of mechanically roughening the surface of the aluminum plate, a method of electrochemically dissolving the surface of the aluminum plate, and a method of chemically dissolving the selected portions of the aluminum plate surface. The mechanical graining includes conventional processes, such as ball graining, brush graining, blast graining, and buffing graining. The electrochemical graining can be carried out in an electrolytic solution such as a hydrochloric acid or nitric acid solution by the application of a direct current or alternating current. Moreover, the above-mentioned mechanical graining and electrochemical graining may be used in combination as disclosed in JP KOKAI No. Sho 54-63902.

The surface-grained aluminum plate thus obtained may be subjected to alkali etching, followed by neutralization. After that, an anodized film may usually be provided on the aluminum plate by anodization to improve the water retention properties and wear resistance.

Any material can be used as an electrolyte in the anodization of the aluminum plate so long as a porous anodized film can be formed on the surface of the aluminum plate. Typically, sulfuric acid, phosphoric acid, oxalic acid, chromic acid, and mixtures thereof are used as the electrolyte. The concentration of the electrolyte is appropriately determined depending upon the kind of electrolyte.

The operating conditions for the anodization cannot be particularly specified because they depend on the type of electrolyte. In general, it is proper that the concentration of the electrolyte be in the range of 1 to 80% by weight, the liquid temperature be controlled to 5 to 70° C., the current density be in the range of 5 to 60 A/dm$^2$, the applied voltage be in the range of 1 to 100 V, and the time for electrolysis be in the range of 10 seconds to 5 minutes. The deposition amount of the anodized film is suitably 1 .0 g/m$^2$ or more, in the light of the sufficient printing durability, and prevention of toning by scratches on non-image areas.

After completion of the anodization, the surface of the aluminum plate may be made hydrophilic, if required. To make the aluminum surface hydrophilic, there can be employed an alkali metal silicate treatment (for example, using an aqueous solution of sodium silicate) as disclosed in U.S. Pat. Nos. 2,714,066, 3,181,461, 3,280,734 and 3,902, 734. In such a silicate treatment, the aluminum substrate is immersed in an aqueous solution of sodium silicate or subjected to electrolysis therein. In addition to the silicate treatment, there can be employed other treatments using potassium fluorozirconate disclosed in JP KOKOKU No. Sho 36-22063 and polyvinylphosphonic acid disclosed in U.S. Pat. Nos. 3,276,868, 4,153,461, and 4,689,272.

The PS plate for lithographic printing for use in the present invention comprises a substrate and the above-mentioned image recording layer formed thereon. When necessary, the PS plate may further comprise an undercoating layer which is interposed between the substrate and the image recording layer.

A variety of organic compounds can be used for formation of the undercoating layer. Examples of such organic compounds include carboxymethyl cellulose; dextrin; gum arabic; organic phosphonic acids such as amino group-containing phosphonic acid (e.g., 2-aminoethyl phosphonic acid), phenylphosphonic acid, naphthylphosphonic acid, alkylphosphonic acid, glycerophosphonic acid, methylenediphosphonic acid, and ethylenediphosphonic acid, which may have a substituent; organic phosphoric acids such as phenylphosphoric acid, naphthylphosphoric acid, alkylphosphoric acid, and glycerophosphoric acid, which may have a substituent; organic phosphinic acids such as phenylphosphinic acid, naphthylphosphinic acid, alkylphosphinic acid and glycerophosphinic acid, which may have a substituent; amino acids such as glycine and β-alanine; and hydrochlorides of hydroxyl group-containing amine, such as hydrochloride of triethanolamine. Those compounds may be used in combination.

An organic undercoating layer comprising at least one organic polymeric compound, which comprises repeating units represented by the following general formula may preferably be used as the foregoing undercoating layer:

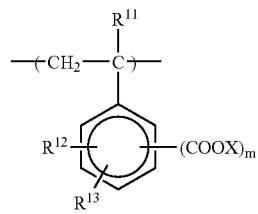

In the above formula, the substituent R$^{11}$ represents a hydrogen atom, a halogen atom or an alkyl group, the substituents R$^{12}$ and R$^{13}$ independently represent a hydrogen atom, a halogen atom, a hydroxyl group, an alkyl group, a substituted alkyl group, an aryl group, a substituted aryl group, —OR$^{14}$, —COOR$^{15}$, —CONHR$^{16}$, —COR$^{17}$ or —CN, the foregoing substituents R$^{12}$ and R$^{13}$ may be bonded together to form a ring structure. In this respect, the substituents R$^{14}$ to R$^{17}$ independently represent an alkyl group or an aryl group. X represents a hydrogen atom, a metal atom or —NR$^{18}$R$^{19}$R$^{20}$R$^{21}$, wherein the foregoing substituents R$^{18}$ to R$^{21}$ independently represent a hydrogen atom, an alkyl group, a substituted alkyl group, an aryl group or a substituted aryl group, provided that R$^{18}$ and R$^{19}$ may be bonded together to form a ring structure. m is an integer ranging from 1 to 3.

The organic undercoating layer can be provided by the following methods. The above-mentioned organic compound is dissolved in water or organic solvents such as methanol, ethanol, and methyl ethyl ketone, or a mixture of such solvents to prepare a coating liquid for forming the undercoating layer. The coating liquid thus prepared is coated on the aluminum plate and then dried, so that an undercoating layer can be provided on the aluminum substrate. Alternatively, an aluminum plate is immersed in the solution prepared by dissolving the above-mentioned organic compound in water or organic solvents such as methanol, ethanol, and methyl ethyl ketone, or a mixture of such solvents to cause the aluminum plate to absorb the compound. Thereafter, the coated surface is washed with water and dried, thereby obtaining an organic undercoating layer on the aluminum substrate. In the former method for providing the undercoating layer, the coating liquid containing the above-mentioned organic compound at concentrations ranging from 0.005 to 10% by weight can be applied to a variety of coating methods. In the latter method, the concentration of the organic compound in the coating liquid is preferably in the range of 0.01 to 20% by weight, more preferably in the range of 0.05 to 5% by weight. The aluminum plate may be immersed in the solution of 20 to 90° C., preferably 25 to 50° C., for 0.1 sec to 20 mm, preferably 2 sec to 1 mm. The coating liquid used to form the undercoating layer may be controlled to pH 1 to 12 by the addition of basic materials such as ammonia, triethylamine, potassium hydroxide and the like, or acidic materials such as hydrochloric acid, phosphoric acid and the like.

It is proper that the deposition amount of the undercoating layer be in the range of 2 to 200 mg/m$^2$ from the aspect of sufficient printing durability, and preferably in the range of 5 to 100 mg/m$^2$.

The heat-sensitive PS plate for lithographic printing thus fabricated is imagewise exposed to light and thereafter subjected to development using the previously mentioned alkaline developing solution.

The light source capable of emitting the active light for achieving the light exposure includes, for example, mercury lamp, metal halide lamp, xenon lamp, chemical lamp, and carbon arc lamp. The radiation includes electron beam, X-ray, ion beam, and far infrared ray, and the like. Further, g-line, i-line, deep-UV and high-density energy beam (laser beam) are also used. The laser beam includes helium-neon laser, argon laser, krypton laser, helium-cadmium laser, KrF excimer laser, and the like. In the present invention, the light sources for emitting the light of wavelengths within the range from the near infrared to infrared region are preferred. In particular, solid laser and semiconductor laser are preferable in the present invention.

After completion of the development, the PS plate is subjected to water washing and/or rinsing and/or gumming up. In the case where the resultant PS plate bears an image portion that needs deleting (for example, an edge of original film), the unnecessary image portion may be deleted by, for example, applying a correction fluid as described in JP KOKOKU No. Hei 2-13293 to the unnecessary image portion and washing the portion with water after a predetermined period of time. Although the above-mentioned method is preferable, another method as described in JP KOKAI No. Sho 59-174842 can also be employed, by which method the active light guided along an optical fiber is applied to the unnecessary image portion, followed by development.

The lithographic printing plate can thus be prepared according to the method of the present invention. A desensitizing gum may be coated on the printing plate, if necessary, before printing operation. When the printing plate is required to have higher printing durability, the printing plate may be subjected to a burning treatment. In this case, it is desirable to treat the printing plate with a liquid for counter-etching as described in JP KOKOKU Nos. Sho 61-2518 and 55-28062, and JP KOKAI Nos. Sho 62-31859 and 61-159655 prior to the burning treatment.

For the treatment of the printing plate with a counter-etch solution, the counter-etch solution may be coated on the printing plate using a sponge or absorbent cotton dampened with the counter-etch solution, or the printing plate may be immersed in the counter-etch solution held in a vat. Further, an automatic coater may be used. After completion of the coating, the coating amount may be made uniform by using a squeegee or squeezing roller to produce more favorable results.

It is proper that the counter-etch solution be coated on the printing plate in a coating amount of 0.03 to 0.8 g/m$^2$ on a dry basis. The printing plate thus coated with the counter-etch solution is dried, and thereafter heated to high temperatures in a burning processor such as a commercially available burning processor "BP-1300" made by Fuji Photo Film Co., Ltd., if necessary. In this case, the heating temperature and the heating time, which vary depending upon the kinds of components constituting the image portion of the printing plate, may preferably be controlled within the range of 180 to 300° C. and 1 to 20 minutes, respectively.

After the burning treatment, the printing plate may appropriately be subjected to the conventional treatments such as water washing, gumming up and the like. When the printing plate has been treated with a counter-etch solution comprising a water-soluble polymer compound, the step of desensitization including gumming up may be omitted. The lithographic printing plate thus obtained can be set in a printing machine such as an offset press to produce large numbers of printed matters.

Other features of this invention will become apparent in the course of the following description of exemplary embodiments, which are given for illustration of the invention and are not intended to be limiting thereof.

EXAMPLES

The present invention will hereinafter be explained in more detail with reference to the following non-limitative working Examples.

(Preparation of Heat-Sensitive PS Plate)

[Preparation of Aluminum Substrate]

An aluminum substrate having a hydrophilic surface was prepared as described below. An aluminum plate of 0.3 mm thickness (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m$^2$. Then it was anodized in a 7% aqueous solution of sulfuric acid at a DC current density of 15 A/dm$^2$ so that the thickness of the resulting anodized layer was 3 g/m$^2$, washed with water, and then dried. The resulting plate was treated with a steam generated from water-boiling, under the steam temperature of 100° C., a relative humidity of 70% and for 30 seconds, thereby 85% of holes on the surface of the plate was sealed.

The aluminum plate was coated with a coating solution consisting of 1 g of β-alanine, 5 g of water and 94 g of methanol, and dried under 80° C. for 30 seconds to obtain a substrate. The coated amount of the undercoating layer after drying was 20 mg/m$^2$.

[Preparation of Heat-Sensitive Layer]

The aluminum substrate with the undercoating layer obtained above was coated with the following coating solution, using a wire bar having a wet coating amount of 19 cc/m², resulting in the coated amount of 1.3g/m², and then dried by a continuous plate throughout drier (a dry oven) employing a convective hot-air heating system under 150° C., for 60 seconds to obtain a heat-sensitive PS plate of a positive-working mode.

<Coating Solution for Forming Heat-Sensitive Layer>

| | |
|---|---|
| 2,3-xylenol/m,p-cresol novolak (2,3-xylenol/m-cresol/p-cresol = 1/4/5) | 1.0 g |
| Cyanine dye A | 0.1 g |
| Phthalic anhydride | 0.05 g |
| P-toluene sulfonic acid | 0.002 g |
| Ethylviolet provided that counter ion is 6-hydroxy-β-naphthalene sulfonic acid | 0.02 g |
| Fluorine atom-containing surfactant (trade name of MEGAFACE F-780-F manufacture by Dainippon Ink and Chemicals, Inc.) | 0.05 g |
| Methyl ethyl ketone | 12 g |

(Preparation of Developing Solution)

<Developing Solutions 1 to 15>

Sodium metasilicate at the concentration of 0.65 mol/liter, a polyethyleneoxide/polypropyleneoxide condensate of ethylenediamine, a polyethyleneoxide compound having an acid radical and an anionic surfactant represented by the following formula as a sludge dispersant, respectively at the concentration summarized in Table 1, and further OLFINE AK-02 manufactured by Nissan Chemical Industries Ltd., at the concentration of 0.02 g/liter for inhibiting foaming were added to water and mixed so as to obtain Developing Solutions 1 to 15.

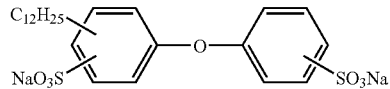

<Comparative Developing Solutions 1 to 6>

In contrast to Developing Solutions 1 to 15, Comparative Developing Solutions 1 to 6 were prepared using a composition without any one of a polyethyleneoxide/polypropyleneoxide condensate of ethylenediamine, a polyethyleneoxide compound having an acid radical and an anionic surfactant as a sludge dispersant.

Compounds for preparing the above developing solutions are as follows.

<Ethylenediamine polyethyleneoxide/polypropyleneoxide Condensate Manufactured by BASF>

Tetronic 304: Molecular weight 1650 (ethyleneoxide=40% by weight)

Tetronic 704: Molecular weight 5500 (ethyleneoxide=40% by weight)

Tetronic 908: Molecular weight 25000 (ethyleneoxide=80% by weight)<

<Polyethyleneoxide Compound Having an Acid Radical>

A: Triton H66 (Dow Chemical Co., Ltd.), polyoxyethylene alkylphenylether phosphate salt B: Pionin A-73-DK (Takemoto Oil and Fat Co., Ltd.), polyoxyethylene fatty alcohol ether phosphate salt C: Polysurf A215C (Dai-Ichi Kogyo Seiyaku Co., Ltd.), polyoxyethylene fatty alcohol ether phosphate salt D: Polysurf A219B (Dai-Ichi Kogyo Seiyaku Co., Ltd.), polyoxyethylene fatty alcohol ether phosphate salt E: AKYPO RLM 45NV (Nikko Chemicals Ltd.), polyoxyethylene alkylether acetic acid salt F: AKYPO RLM 100NV (Nikko Chemicals Ltd.), polyoxyethylene alkylether acetic acid salt <Anionic Surfactant>

Eleminol MON-2 (Sanyo Chemical Industries Ltd.), 50% aqueous solution of alkyldiphenylether disulfonic acid disodium salt

TABLE 1

| Developing Solution No. | Ethylenediamine EO/PO condensate (g/liter) | | | Polyethyleneoxide compound having an acid radical (g/liter) | Anionic Surfactant (g/liter) |
|---|---|---|---|---|---|
| | Tetronic 304 Mw: 1650 | Tetronic 704 Mw: 5500 | Tetronic 908 Mw: 25000 | | |
| 1 | 1.6 | — | — | A: 15 | 0.4 |
| 2 | 1.6 | 0.1 | — | A: 15 | 0.4 |
| 3 | 1.6 | — | 0.01 | A: 15 | 0.4 |
| 4 | — | 1.0 | — | A: 15 | 0.4 |
| 5 | — | — | 0.5 | A: 15 | 0.4 |
| 6 | 1.6 | 0.1 | 0.005 | A: 15 | 0.4 |
| 7 | 1.6 | 0.1 | — | A: 1 | 0.4 |
| 8 | 1.6 | 0.1 | — | A: 2 | 0.4 |
| 9 | 1.6 | 0.1 | — | A: 25 | 0.4 |
| 10 | 1.6 | 0.1 | — | A: 50 | 0.4 |
| 11 | 1.6 | 0.1 | — | B: 15 | 0.4 |
| 12 | 1.6 | 0.1 | — | C: 15 | 0.4 |
| 13 | 1.6 | 0.1 | — | D: 15 | 0.4 |
| 14 | 1.6 | 0.1 | — | E: 15 | 0.4 |
| 15 | 1.6 | 0.1 | — | F: 15 | 0.4 |
| Comp. 1 | 1.6 | 0.1 | — | A: 15 | — |
| Comp. 2 | 1.6 | 0.1 | — | — | 0.4 |
| Comp. 3 | 1.6 | — | — | — | 0.4 |

TABLE 1-continued

| Developing Solution No. | Ethylenediamine EO/PO condensate (g/liter) | | | Polyethyleneoxide compound having an acid radical (g/liter) | Anionic Surfactant (g/liter) |
| --- | --- | --- | --- | --- | --- |
| | Tetronic 304 Mw: 1650 | Tetronic 704 Mw: 5500 | Tetronic 908 Mw: 25000 | | |
| Comp. 4 | — | 1.0 | — | — | 0.4 |
| Comp. 5 | — | — | 0.5 | — | 0.4 |
| Comp. 6 | 1.6 | 0.1 | — | — | — |

(Evaluation of Image-Forming Performance)

The image-forming performance residing in the above developing solutions was determined as follows. The developing solutions were used to carry out a developing procedure under a uniform condition, and a sensitivity and a decrement of an image layer were evaluated. Finally, the image-forming performance is considered to be better as the sensitivity measured below becomes higher and the decrement of image layer measured below becomes smaller.

Using a commercially available plate setter "Trendsetter" (trade name), made by Creo Products Inc., the light beam with an intensity range of 2 to 10 W was imagewise applied to the above-mentioned PS plates at a rotational drum frequency of 150 rpm to form a solid image thereon. After completion of the light exposure, each PS plate was developed over a period of 40 seconds to obtain a printing plate using a PS processor "FLH-85E" manufactured by Glunz&Jensen whose development tank was charged with each of Developing Solutions 1 to 15 and Comparative Developing Solution 1 to 6, and whose post-treatment tank was charged with Finisher "FP-2W" made by Fuji Photo Film Co., Ltd. with water at a ratio of 1:1, with the developing solution being maintained at 22.5° C.

After completion of the development, the printing plate was observed with a 25×loupe to recognize that the light-exposed image forming layer portions were eliminated from the PS plate to such a degree that no scumming would occur. Then, from a light beam intensity at a portion on the plate which had no residue of the light-exposed image recording layer, an actual exposure energy was calculated, and said exposure energy was determined as a sensitivity. The sensitivity is considered to be higher as the exposure energy becomes smaller.

Then, the density of an image portion on the obtained printing plate was measured with a Gretag-Macbeth D19C reflection densitometer (made by Gretag-Macbeth GmbH) using the cyan color channel. Before the development, the density of an image forming layer portion in the PS plates was also measured in the same manner as mentioned above for comparison.

The decrement of image layer was evaluated in terms of a difference in the above densities before and after the development. The decrement of image layer is considered to be smaller and more favorable as the difference in the densities before and after the development becomes smaller. The results are shown in Table 2.

[Evaluation of Development Sludge]

Using a plate setter "Trendsetter" (trade name), made by Creo Products Inc., the light beam with an intensity of 10 W was imagewise applied to the above-mentioned PS plates at a rotational drum frequency of 150 rpm to form a solid image thereon. After completion of the light exposure, the PS plate 20 m² was developed over a period of 40 seconds to obtain a printing plate using a PS processor "FLH-85E" manufactured by Glunz&Jensen whose development tank was charged with each of Developing Solutions 1 to 15 and Comparative Developing Solution 1 to 6, and whose post-treatment tank was charged with Finisher "FP-2W" made by Fuji Photo Film Co., Ltd. with water at a ratio of 1:1, with the developing solution being maintained at 22.5° C.

Each of Developing Solutions 1 to 15 and Comparative Developing. Solution 1 to 6 used in the above development was sampled into a one liter polyethylene bottle, and left for a day at a room temperature, and then occurrence of sludge in the bottom of the bottle was observed visually. In case that the sedimentation was recognized in the bottom of the bottle, the developing solution was stirred with a magnetic stirrer at 500 rpm for 10 minutes and then observed again visually. The results are shown in Table 2.

The criteria of observation is below.

o: No sedimentation was observed in the bottom of the bottle.

☐: Sedimentation was slightly observed in the bottom of the bottle. The sedimentation dissolved and disappeared when the developing solution was stirred.

x: Sedimentation was observed in the bottom of the bottle. The sedimentation remained when the developing solution was stirred.

[Evaluation of Performance of Development Inhibitor Consumption]

To each of Developing Solutions 1 to 15 and Comparative Developing Solution 1 to 6, 2,3-xylenol/m,p-cresol novolak (2,3-xylenol/m-cresol/p-cresol=1/4/5) was added at the diverse concentrations of 1.0 g/liter, 2.0 g/liter, 3.0 g/liter, 5.0 g/liter, 7.5 g/liter and 10.0 g/liter, and then the mixture thereof was stirred with an impeller to completely dissolve the components.

Using a plate setter "Trendsetter" (trade name), made by Creo Products Inc., the light beam with an intensity of 10 W was imagewise applied to the above-mentioned PS plates at a rotational drum frequency of 150 rpm to form a solid image thereon. After completion of the light exposure, the PS plate 20 m² was developed over a period of 40 seconds to obtain a printing plate using a PS processor "FLH-85E" manufactured by Glunz&Jensen whose development tank was charged with each of the above solutions, and whose post-treatment tank was charged with Finisher "FP-2W" made by Fuji Photo Film Co., Ltd. with water at a ratio of 1:1, with the developing solution being maintained at 22.5° C.

The development inhibitor, i.e., an ethylenediamine EO/PO condensate that adheres to a novolak resin dissolving in the developing solution, is thus consumed with the novolak resin, and therefore the effect of inhibiting development is decreased and this condition will lead to deterioration of image-forming performance.

In this test, when a novolak resin was present at the diverse concentrations of from 1.0 g/liter to 10.0 g/liter described above in a developing solution, it was determined whether normal image formation was accomplished or not, by evaluating a sensitivity and a decrement of an image layer according to the above procedure. The result is shown as a maximum novolak resin concentration (g/liter) in the developing solution at which normal image formation was accomplished without problems on the sensitivity and the decrement of image layer. Accordingly, the performance of development inhibitor consumption is considered to be better as the resultant novolak resin concentration becomes bigger.

TABLE 2

| Developing Solution No. | Image-forming Performance | | Sludge Occurrence | Performance of Development Inhibitor Consumption |
|---|---|---|---|---|
| | Sensitivity (W) | Decrement of Image Layer | | |
| 1 | 4 | 0.07 | ○ | 10.0 |
| 2 | 4.25 | 0.03 | ○ | 10.0 |
| 3 | 4.25 | 0.03 | ○ | 10.0 |
| 4 | 4 | 0.03 | ○ | 7.5 |
| 5 | 4 | 0.02 | ○ | 5.0 |
| 6 | 4 | 0.02 | ○ | 10.0 |
| 7 | 4.25 | 0.03 | ○ | 5.0 |
| 8 | 4.25 | 0.03 | ○ | 7.5 |
| 9 | 4.25 | 0.03 | ○ | 10.0 |
| 10 | 4.25 | 0.03 | ○ | 10.0 |
| 11 | 4.25 | 0.03 | ○ | 10.0 |
| 12 | 4.25 | 0.03 | ○ | 10.0 |
| 13 | 4.25 | 0.03 | ○ | 10.0 |
| 14 | 4.25 | 0.03 | ○ | 10.0 |
| 15 | 4.25 | 0.03 | ○ | 10.0 |
| Comp. 1 | 4.25 | 0.03 | □ | 10.0 |
| Comp. 2 | 4.25 | 0.03 | ○ | 2.0 |
| Comp. 3 | 4 | 0.07 | ○ | 1.0 |
| Comp. 4 | 4 | 0.03 | ○ | not more than 1.0 |
| Comp. 5 | 4 | 0.02 | ○ | not more than 1.0 |
| Comp. 6 | 4.25 | 0.03 | X | 1.0 |

As seen from the results in Table 2, the use of the developing solution according to the present invention can prevent the development inhibitor which largely affects image formation from being consumed, and makes it possible that stable image formation is accomplished for a long period even when an image recording layer component dissolves into the developing solution.

What is claimed is:

1. A method for making a lithographic printing plate comprising the steps of: light-exposing to infrared radiation, a heat-sensitive presensitized plate of a positive-working mode for use in making a lithographic printing plate, said presensitized plate comprising a substrate and an image recording layer which is formed thereon and which comprises a novolak resin containing xylenol selected from the group consisting of 3,5-xylenol, 2,3-xylenol, 2,5-xylenol and 3,4-xylenol, as a monomer component, and an infrared absorbing dye; and developing the light-exposed plate with an alkaline developing solution comprising a polyoxyalkylene adduct of alkylene diamine having a molecular weight of not more than 2000 and a polyoxyalkylene adduct of alkylene diamine having a molecular weight of not less than 3000, the amount of the polyoxyalkylene adduct of alkylene diamine having a molecular weight of not more than 2000 being 5 to 200 times the amount of the polyoxyalkylene adduct of alkylene diamine having a molecular weight of not less than 3000, wherein the total amount of polyoxyalkylene adducts of alkylene diamine is from 0.001 to 10% by weight, a polyoxyalkylene compound having an acid radical in an amount of from 0.001 to 20% by weight, and an anionic surfactant in an amount of from 0.001 to 20% by weight, said alkaline developing solution having a pH of from 12.5 to 14.0.

2. The method of claim 1, wherein the novolak resin containing xylenol as a monomer component has a weight-average molecular weight of 500 to 10,000.

3. The method for making a lithographic printing plate of claim 1, wherein the polyoxyalkylene adducts of alkylene diamine in the alkaline developing solution are selected from the group consisting of the compounds represented by the following formula (I):

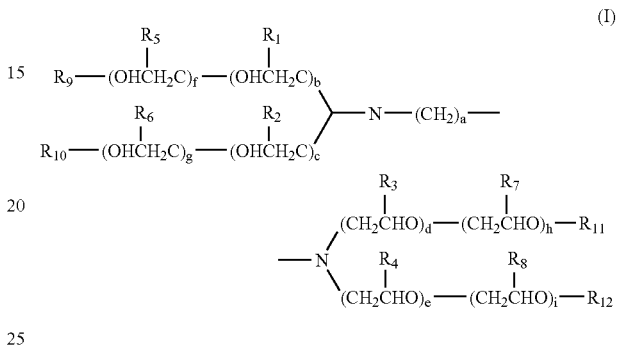

wherein $R_1$, $R_2$, $R_3$, $R_4$, $R_5$, $R_6$, $R_7$ and $R_8$ may be the same or different, and each independently represents H or —$CH_3$, and $R_9$, $R_{10}$, $R_{11}$ and $R_{12}$ may be the same or different, and each independently represents H, —$CH_3$, —$COR_{13}$ or —$CONHR_{14}$ (wherein each of $R_{13}$ and $R_{14}$ represents an alkyl, aryl, alkenyl or alkynyl group), a represents an integer of from 2 to 12, b, c, d, e, f, g, h and i may be the same or different, and each independently represents 0 or an integer of from 1 to 300, and (b+f)(c+g)(d+h)(e+i)≠0.

4. The method for making a lithographic printing plate of claim 1, wherein the polyoxyalkylene compound having an acid radical in the alkaline developing solution is selected from the group consisting of the compounds represented by the following general formula (II):

X—(CH$_2$CH$_2$O)n-Y (II)

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, and Y represents a phosphate residue or a carboxylic acid residue.

5. The method for making a lithographic printing plate of claim 4, wherein the polyoxyalkylene compound having an acid radical is selected from the group consisting of the compounds represented by the following formula (III):

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, and M represents independently a hydrogen atom, an alkali metal atom or an ammonium.

6. The method for making a lithographic printing plate of claim 4, wherein the polyoxyalkylene compound having an acid radical is selected from the group consisting of the compounds represented by the following formula (IV):

X—(CH$_2$CH$_2$O)n-C$_p$H$_{2p}$—COOM  (IV)

wherein X represents a group selected from R—O—, R—C(O)—O— and R—C(O)—NH— (wherein R represents an alkyl group, an alkenyl group, an aromatic hydrocarbon group or a heteroaromatic group), n represents an integer of from 4 to 30, p represents zero or an integer of from 1 to 30, and M represents independently a hydrogen atom, an alkali metal atom or an ammonium.

7. The method for making a lithographic printing plate of claim 1, wherein the anionic surfactant is selected from the group consisting of fatty alcohol sulfuric ester salts, alkyl aryl sulfonic acid salts, sulfuric esters of fatty alcohol having carbon atoms of from 8 to 22, aliphatic alcohol phosphoric ester salts, alkyl amide sulfonic acid salts, sulfonic acid salts of bibasic aliphatic ester, hydroxyalkane sulfonic acid salts, alkane sulfonic acid salts, alkyl diphenylether sulfonic acid salts, diphenylether disulfonic acid salts, dialkyl sulfosuccinate salts, olefin sulfonic acid salts, linear alkyl benzene sulfonic acid salts, branched alkyl benzene sulfonic acid salts, alkyl naphthalene sulfonic acid salts, alkyl phenoxy polyoxyethylene propyl sulfonic acid salts, polyoxyethylene alkyl sulfophenylether salts, disodium N-alkyl sulfosuccinate monoamides, and petroleum sulfonic acid salts.

8. The method of making a lithographic printing plate of claim 1, wherein the alkaline developing solution comprises the polyoxyalkylene adducts of alkylene diamine in the amount of from 0.005 to 5% by weight.

9. The method of making a lithographic printing plate of claim 1, wherein the alkaline developing solution comprises the polyoxyalkylene compound having an acid radical in the amount of from 0.1 to 10% by weight.

* * * * *